US009691694B2

(12) United States Patent
Jow et al.

(10) Patent No.: US 9,691,694 B2
(45) Date of Patent: Jun. 27, 2017

(54) SUBSTRATE COMPRISING STACKS OF INTERCONNECTS, INTERCONNECT ON SOLDER RESIST LAYER AND INTERCONNECT ON SIDE PORTION OF SUBSTRATE

(71) Applicant: QUALCOMM Incorporated, San Diego, CA (US)

(72) Inventors: Uei-Ming Jow, San Diego, CA (US); Young Kyu Song, San Diego, CA (US); Jong-Hoon Lee, San Diego, CA (US); Xiaonan Zhang, San Diego, CA (US); Mario Francisco Velez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/703,290

(22) Filed: May 4, 2015

(65) Prior Publication Data

US 2016/0240463 A1 Aug. 18, 2016

Related U.S. Application Data

(60) Provisional application No. 62/117,835, filed on Feb. 18, 2015.

(51) Int. Cl.
*H01L 23/48* (2006.01)
*H01L 21/336* (2006.01)
(Continued)

(52) U.S. Cl.
CPC ...... *H01L 23/49827* (2013.01); *H01L 21/486* (2013.01); *H01L 21/4857* (2013.01);
(Continued)

(58) Field of Classification Search
CPC ............. H01L 21/563; H01L 21/67236; H01L 23/3114; H01L 23/4951; H01L 23/538;
(Continued)

(56) References Cited

U.S. PATENT DOCUMENTS 5,866,942 A 2/1999 Suzuki et al.
6,388,207 B1 5/2002 Figueroa et al.
(Continued)

OTHER PUBLICATIONS

International Search Report and Written Opinion—PCT/US2016/018345—ISA/EPO—May 6, 2016.

*Primary Examiner* — Julio J Maldonado
*Assistant Examiner* — Moin Rahman
(74) *Attorney, Agent, or Firm* — Loza & Loza, LLP/Qualcomm

(57) ABSTRACT

An integrated circuit device that includes a package substrate and a die coupled to the package substrate. The package substrate includes at least one dielectric layer, a first stack of first interconnects in the at least one dielectric layer, and a second interconnect formed on at least one side portion of the at least one dielectric layer. The first stack of first interconnects is configured to provide a first electrical path for a non-ground reference signal, where the first stack of first interconnects is located along at least one side of the package substrate. The second interconnect is configured to provide a second electrical path for a ground reference signal.

33 Claims, 25 Drawing Sheets

PROFILE VIEW

PLAN VIEW ACROSS SOLDER BALL PADS / SOLDER BALLS

(51) Int. Cl.
  *H01L 23/498* (2006.01)
  *H01L 23/00* (2006.01)
  *H01L 21/48* (2006.01)
  *H01L 23/50* (2006.01)

(52) U.S. Cl.
  CPC .. *H01L 23/49805* (2013.01); *H01L 23/49811* (2013.01); *H01L 23/49822* (2013.01); *H01L 23/49838* (2013.01); *H01L 23/50* (2013.01); *H01L 24/17* (2013.01); *H01L 2224/16055* (2013.01); *H01L 2224/16057* (2013.01); *H01L 2224/16227* (2013.01); *H01L 2224/16235* (2013.01); *H01L 2224/16237* (2013.01); *H01L 2924/15311* (2013.01)

(58) Field of Classification Search
  CPC ..... H01L 23/5389; H01L 24/01; H01L 24/10; H01L 24/18; H01L 24/82; H01L 2021/60022; H01L 2224/01; H01L 2224/08135; H01L 2224/32135; H01L 2224/82
  USPC ....... 257/774, 522, 419, 773, 758, 737, 499, 257/762, 764, 506; 438/303, 591, 618, 438/421, 584, 637, 783, 763
  See application file for complete search history.

(56) References Cited

U.S. PATENT DOCUMENTS

| | | | |
|---|---|---|---|
| 6,674,159 | B1 | 1/2004 | Peterson et al. |
| 7,534,653 | B2 | 5/2009 | Hsuan et al. |
| 8,115,112 | B2 | 2/2012 | Corisis et al. |
| 2003/0085055 | A1 | 5/2003 | Skinner et al. |
| 2003/0232492 | A1 | 12/2003 | Venkateswaran |
| 2004/0094834 | A1 | 5/2004 | Jun et al. |
| 2007/0007665 | A1* | 1/2007 | Clevenger ............... H01L 23/13 257/780 |
| 2008/0038874 | A1* | 2/2008 | Lin ....................... H01L 21/568 438/118 |
| 2008/0099912 | A1* | 5/2008 | Wu ....................... H01L 23/142 257/737 |
| 2008/0258259 | A1* | 10/2008 | Osaka ................... H01L 23/481 257/532 |
| 2011/0215464 | A1* | 9/2011 | Guzek ................... H01L 21/568 257/737 |
| 2012/0104601 | A1 | 5/2012 | Badakere et al. |
| 2012/0187581 | A1 | 7/2012 | Shimada et al. |
| 2012/0326293 | A1 | 12/2012 | Kobayashi et al. |
| 2014/0042612 | A1* | 2/2014 | Liu ................... H01L 21/76807 257/734 |

* cited by examiner

PROFILE VIEW

PLAN VIEW ACROSS SOLDER BALL PADS / SOLDER BALLS

PLAN VIEW ACROSS SOLDER BALL PADS / SOLDER BALLS

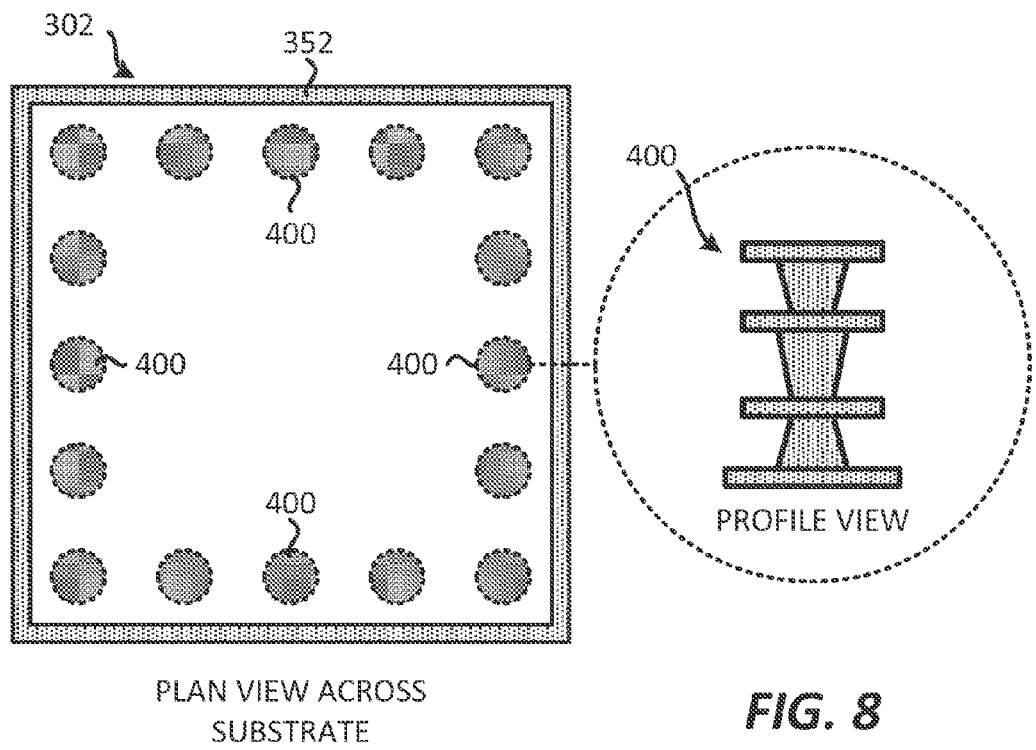
PLAN VIEW ACROSS SUBSTRATE
FIG. 7
FIG. 8
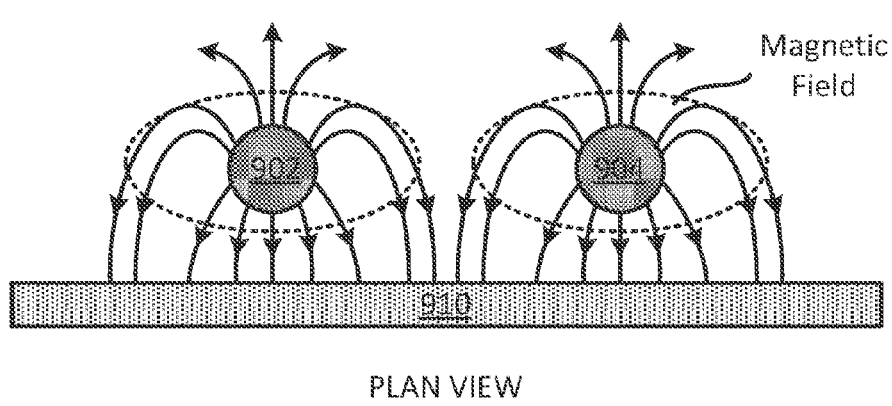
PLAN VIEW
FIG. 9

PLAN VIEW ACROSS SUBSTRATE

PLAN VIEW

PROFILE VIEW

PLAN VIEW ACROSS
SUBSTRATE

PROFILE VIEW

PROFILE VIEW

PLAN VIEW

PROFILE VIEW

PROFILE VIEW

PLAN VIEW OF GROUND REFERENCE LAYER

○ First signal Solder Ball (e.g., Ground Reference Solder Ball)

● Second Signal Solder Ball (e.g., Power, Input/Output Ball)

PLAN VIEW OF GROUND REFERENCE LAYER WITH SOLDER BALLS

PLAN VIEW OF PATTERNED GROUND REFERENCE LAYER

○ First signal Solder Ball (e.g., Ground Reference Solder Ball)

● Second Signal Solder Ball (e.g., Power, Input/Output Ball)

PLAN VIEW OF PATTERNED GROUND REFERENCE LAYER WITH SOLDER BALLS

SUBSTRATE COMPRISING STACKS OF INTERCONNECTS, INTERCONNECT ON SOLDER RESIST LAYER AND INTERCONNECT ON SIDE PORTION OF SUBSTRATE

CLAIM OF PRIORITY/CLAIM OF BENEFIT

The present application claims priority to U.S. Provisional Application No. 62/117,835 titled "Substrate Comprising Stacks of Interconnects, Interconnect on Solder Resist Layer and Interconnects on Side Portion of Substrate", filed Feb. 18, 2015, which is hereby expressly incorporated by reference herein.

BACKGROUND

Field

Various features relate to a substrate that includes stacks of interconnects, an interconnect on a solder resist layer and an interconnect on a side portion of the substrate.

Background

FIG. 1 illustrates a die 100 mounted on a substrate 102. The substrate 102 is mounted on a printed circuit board (PCB) 106 through a set of solder balls 104. The substrate 102 may include several traces, pads and vias (which are not shown). These traces, pads, and vias are used to provide electrical paths to and from the die 100. The set of solder balls 104 are configured to provide electrical paths for a ground reference signal, power signals and input/output signals. However, current integrated circuit designs of the substrate 102 require that the number of solder balls (from the set of solder balls 260) used for a ground reference signal be about the same as the number of solder balls (from the set of solder balls 260) used for power signals and input/output signals. Typically, a signal solder ball configured to provide an electrical path for a power signal or input/output signal is required to be located next to a ground solder ball that is configured to provide an electrical path for a ground reference signal. For example, as shown in FIGS. 1 and 2, the solder balls 140 are arranged in an alternative matter to provide an electrical path for a ground reference signal (G) and a non-ground reference signal (S). This requirement results in solder balls taking up a lot real estate in an integrated device package and/or the substrate 102. As shown in FIG. 2, the solder balls configured to provide an electrical path for a ground reference signal (G) make up a majority of the solder balls. Solder balls that are used for providing an electrical path for a ground reference signal (G) is an opportunity cost, since that solder balls cannot be used to provide a non-ground reference signal.

There is a constant need to reduce the size and/or form factors of an integrated device package. Often times, the size of the solder balls limit how small an integrated device package can be, since solder balls are large relative to other interconnects in the substrate. This in turns, limits how closely and densely interconnects can be formed in an integrated device package and/or package substrate.

Therefore, there is a need for an improved integrated device package and/or package substrate. Ideally, such an integrated device package and/or package substrate will have a better solder ball design that will allow for a smaller form factor for the integrated device package and/or the package substrate while also having better performance, without having to sacrifice the structural stability of the device.

SUMMARY

A first example provides an integrated circuit device that includes a package substrate and a die coupled to the package substrate. The package substrate includes at least one dielectric layer, a first stack of first interconnects in the at least one dielectric layer, and a second interconnect formed on at least one side portion of the at least one dielectric layer. The first stack of first interconnects is configured to provide a first electrical path for a non-ground reference signal, where the first stack of first interconnects is located along at least one side of the package substrate. The second interconnect is configured to provide a second electrical path for a ground reference signal.

A second example provides an integrated circuit device that includes a package substrate and a die coupled to the package substrate. The package substrate includes at least one dielectric layer, a solder resist layer on the at least one dielectric layer, a first stack of first interconnects in the at least one dielectric layer, and a second interconnect formed on the solder resist layer. The first stack of first interconnects is configured to provide a first electrical path for a non-ground reference signal, where the first stack of first interconnects is located along at least one side of the package substrate. The second interconnect is configured to provide a second electrical path for a ground reference signal.

A third example provides a device that includes a package substrate and a die coupled to the package substrate through a set of solder balls. The package substrate includes at least one dielectric layer, a first stack of first interconnects in the at least one dielectric layer, and a second interconnect formed on at least one side portion of the at least one dielectric layer. The first stack of first interconnects is configured to provide a first electrical path for a non-ground reference signal, where the first stack of first interconnects is located along at least one side of the package substrate. The second interconnect is configured to provide a second electrical path for a ground reference signal.

A fourth example a device that includes a package substrate and a die coupled to the package substrate through a set of solder balls. The package substrate includes at least one dielectric layer, a solder resist layer on the at least one dielectric layer, a first stack of first interconnects in the at least one dielectric layer, and a second interconnect formed on the solder resist layer. The first stack of first interconnects is configured to provide a first electrical path for a non-ground reference signal, where the first stack of first interconnects is located along at least one side of the package substrate. The second interconnect is configured to provide a second electrical path for a ground reference signal. At least one of the solder balls from the set of solder balls is coupled to the second interconnect.

A fifth example provides a method for fabricating a package substrate. The method forms at least one dielectric layer. The method forms a first electrical path for at least one non-ground reference signal, where forming the first electrical path comprises forming a first stack of first interconnects in the at least one dielectric layer such that the first stack of first interconnects is located along at least one side of the package substrate. The method forms a second electrical path for a ground reference signal, where forming the second electrical path comprises forming a second interconnect on at least one side portion of the at least one dielectric layer.

DRAWINGS

Various features, nature and advantages may become apparent from the detailed description set forth below when taken in conjunction with the drawings in which like reference characters identify correspondingly throughout.

FIG. 7 illustrates a plan view of a package substrate that includes stacks of interconnects and an interconnect on a side portion of the package substrate.

FIG. 8 illustrates a profile view of an exemplary stacks of interconnects.

FIG. 9 illustrates electrical properties of three interconnects.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

The present disclosure describes a package substrate that includes at least one dielectric layer, a set of first stacks of interconnects in the at least one dielectric layer, and a second interconnect formed on at least one side portion of the at least one dielectric layer. The set of first stacks of interconnects is configured to provide at least one first electrical path for at least one non-ground reference signal. The set of first stacks of interconnects is positioned (e.g., aligned) along at least one side of the package substrate. The second interconnect is configured to provide a second electrical path for a ground reference signal.

Figure 3:
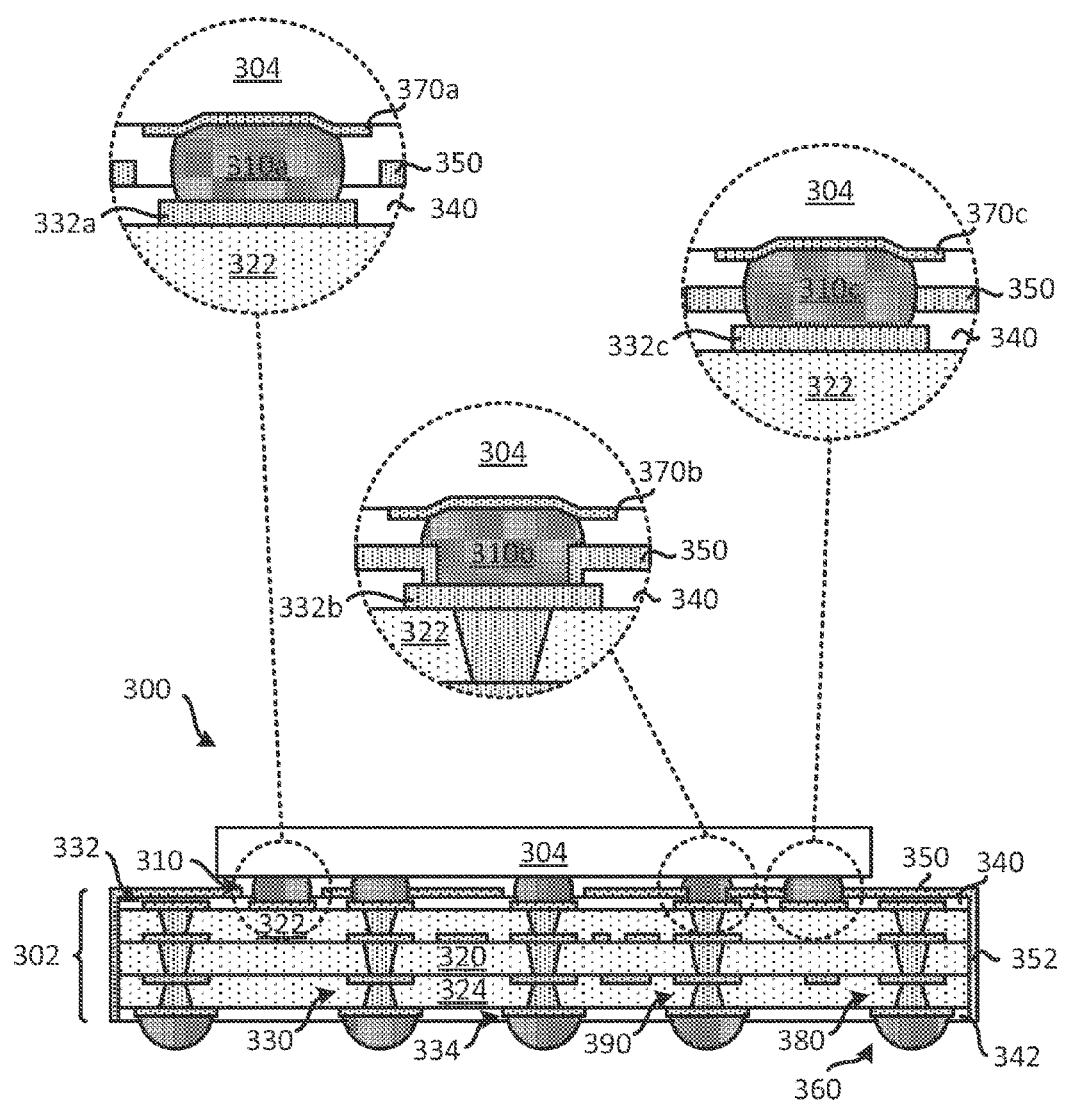
FIG. 3 illustrates an integrated device package comprising a package substrate that includes stacks of interconnects, an interconnect on a solder resist layer, and an interconnect on a side portion of the package substrate.

Exemplary Integrated Device Package Comprising Substrate with Stacks of Interconnects, Interconnect on Solder Resist Layer and Interconnect on Side Portion of Substrate FIG. 3 illustrates a profile view of an integrated device package 300 (e.g., integrated circuit device) that includes a substrate 302 and a die 304. The die 304 may be a bare die. The die 304 may be an integrated circuit (IC) that includes several transistors and/or other electronic components. The die 304 is coupled to the substrate 302 through a first set of solder balls 310. The first set of solder balls 310 includes solder ball 310a, solder ball 310b, and solder ball 310c.

The substrate 302 may be a package substrate and/or an interposer. The substrate 302 includes a first dielectric layer 320, a second dielectric layer 322, and a third dielectric layer 324. In some implementations, the first dielectric layer 320 may be a core layer; the second dielectric layer 322 may be a prepeg layer; and the third dielectric layer 324 may be a prepeg layer. In some implementations, the substrate 302 may be a coreless substrate. In such instances, the first dielectric layer 320, the second dielectric layer 322, and the third dielectric layer may be prepeg layers.

The substrate 302 also include a first set of interconnects 330, a second set of interconnects 332, and a second set of interconnects 334. A set of interconnects may include one or more interconnects. An interconnect may include a trace, a pad, and/or a via. The first set of interconnects 330 may include a set of vias located in the first dielectric layer 320. The first set of interconnects 330 (which may include traces, pads, and/or vias) may also be located in the second dielectric layer 322. The first set of interconnects 330 may also be located in the third dielectric layer 324.

The second set of interconnects 332 is located on the second dielectric layer 322. The second set of interconnects 332 may include a set of traces and/or a set of pads. In some implementations, the second set of interconnects 332 may be embedded in the second dielectric layer 322. The second set of interconnects 332 includes pad 332a, pad 332b, and pad 332c. The second set of interconnects 332 is coupled to the first set of interconnects 330. The pad 332a, the pad 332b, and the pad 332c may be solder balls pads configured to be coupled to solder balls (e.g., solder ball 210a). The pad 332a, the pad 332b, and the pad 332c may be die side pads. The die side of a substrate is the side of substrate facing the die when a die is coupled to the substrate.

The third set of interconnects 334 is located on the third dielectric layer 324. The third set of interconnects 334 may include a set of traces and/or a set of pads. In some implementations, the third set of interconnects 334 may be embedded in the third dielectric layer 324. The third set of interconnects 334 is coupled to the first set of interconnects 330. The first set of solder balls 360 is coupled to the third set of interconnects 334. For example, the first set of solder balls 360 is coupled to pads (e.g., solder ball pads) from the third set of interconnects 334. The pads from the third set of interconnects may be printed circuit board (PCB) side pads. The PCB side of the substrate is the side of substrate facing the PCB when the substrate is coupled to the PCB. A package substrate includes interconnects that have smaller dimensions (e.g., smaller pitch, smaller spacing) than interconnects on a PCB.

The substrate 302 also includes a set of first stacks of interconnects 380 (e.g., first stack of first interconnects) and a set of second stacks of interconnects 390 second stack of second interconnects, third stack of third interconnects, fourth stack of fourth interconnects). The set of first stacks of interconnects 380 may be configured to provide at least one first electrical path for at least one first non-ground reference signal (e.g., first power signal, first input/output signal, second input/output signal). The set of first stacks of interconnects 380 is located in the substrate 302 such that the set of first stacks of interconnects 380 is at least partially within or near the periphery or perimeter of the substrate 302. In some implementations, the periphery of the substrate 302 includes an area and/or portion of the substrate 302 that is about within 300 microns (μm) or less of a side portion (e.g., side wall, side edge) of the substrate 302. The set of first stacks of interconnects 380 may be defined by interconnects from the first set of interconnects 330, the second set of interconnects 332, and/or the third set of interconnects 334. The set of second stacks of interconnects 390 may be configured to provide at least one second electrical path for at least one second ground reference signal. The set of second stacks of interconnects 390 may be defined by interconnects from the first set of interconnects 330, the second set of interconnects 332, and/or the third set of interconnects 334. The set of first stacks of interconnects 380 and the set of second stacks of interconnects 390 are further described in details below in FIGS. 4 and 7-11.

The substrate 302 also includes a first solder resist layer 340, a second solder resist layer 342, a surface interconnect 350, and a side interconnect 352. The first solder resist layer 340 is located on the second dielectric layer 322. The second solder resist layer 342 is located on the third dielectric layer 324.

The surface interconnect 350 is located on the first solder resist layer 340. The surface interconnect 350 may include openings cavities) over one or more pads. These openings are portions of the surface interconnect 350 that solder balls 310 are placed to couple the die 304 to the substrate 302. The surface interconnect 350 may be configured to provide at least one second electrical path for at least one ground reference signal (e.g., at least one second signal). The surface interconnect 350 may be configured to couple, by way of an electrical field, to some of the interconnects from the second set of interconnects 332. For example, the surface interconnect 350 may be configured to couple, by way of an electrical field, to interconnects from the second set of interconnects 323 that are configured to provide an electrical path for non-ground reference signals (e.g., power signals, input/output signals). Examples of coupling by way of electric field are further described in detail below in at least FIGS. 9 and 11.

The surface interconnect 350 may have different shapes and/or configurations in different implementations. Examples of different shapes and/or configurations of a surface interconnect 350 on a substrate are further described below in at least FIGS. 23-26. As will be further described in at least FIGS. 23-26, the surface interconnect 350 may be a patterned surface interconnect 350.

FIG. 3 illustrates that the surface interconnect 350 is coupled to (e.g., touching) some of the solder balls from the set of solder balls 310. For example, the surface interconnect 350 is coupled to at least solder ball 310b and solder ball 310c. In some implementations, the solder ball 310b and the solder ball 310c are configured to provide at least one second electrical path for at least one ground reference signal (e.g., second signal). FIG. 3 further illustrates that the surface interconnect 350 is not coupled to (e.g., not touching) solder ball 310a. The solder ball 310a is configured to provide at least one first electrical path for at least one first signal. The first signal may be a non-ground reference signal (e.g., a power signal, an input/output (I/O) signal).

The side interconnect 352 is located on at least one side (e.g., side portion, side wall) of the substrate 302. The side interconnect 352 may cover some portions or all portions of the sides of the substrate 302. The side interconnect 352 may be configured to provide at least one second electrical path for at least one ground reference signal (e.g., at least one second signal). The side interconnect 352 is coupled to the surface interconnect 350. In some implementations, the side interconnect 352 may be the same metal layer as the surface interconnect 350. The side interconnect 352 may cover at least portions of the first dielectric layer 320, the second dielectric layer 322, the third dielectric layer 324, the first solder resist layer 340, and/or the second solder resist layer 342. The side interconnect 352 may have different shapes and/or configurations in different implementations, Examples of different configurations of a side interconnect 352 on a substrate are further described below in at least FIGS. 7, 10, and 13-19. As will be further described in at least FIGS. 10, and 13-19, the side interconnect 352 may be a patterned side interconnect 352.

As mentioned above, the die 204 is coupled to the substrate 302 through the first set of solder balls 360. The die 204 includes a set of under bump metallization (UBM) layers 370. The set of UBM layers 370 includes UBM layer 370a, UBM layer 370b, and UBM layer 370c.

FIG. 3 illustrates that the UBM layer 370a is coupled to the solder ball 310a. The solder ball 310a is coupled to the pad 332a. However, the solder ball 310a does not touch the surface interconnect 350. In some implementations, the solder ball 310a and the pad 332a are configured to provide an electrical path for a first signal (e.g., power signal, input/output signal).

FIG. 3 also illustrates that the UBM layer 370b is coupled to the solder ball 310b. The solder ball 310b is coupled to the pad 332b. The solder ball 310b is also coupled to the surface interconnect 350. The surface interconnect 350 is coupled to the pad 332b. The surface interconnect 350 covers at least a side portion of the solder resist layer 340. In some implementations, the solder ball 310b, the pad 332b, and the surface interconnect 350 are configured to provide an electrical path for a second signal (e.g., ground reference signal).

FIG. 3 further illustrates that the UBM layer 370c is coupled to the solder ball 310c. The solder ball 310c is coupled to the pad 332c. The solder ball 310c is also coupled to the surface interconnect 350. The surface interconnect 350 is not directly coupled to (e.g., not directly touching) the pad 332c. In some implementations, the solder ball 310c, the pad 332c, and the surface interconnect 350 are configured to provide an electrical path for a second signal (e.g., ground reference signal).

Figure 4:
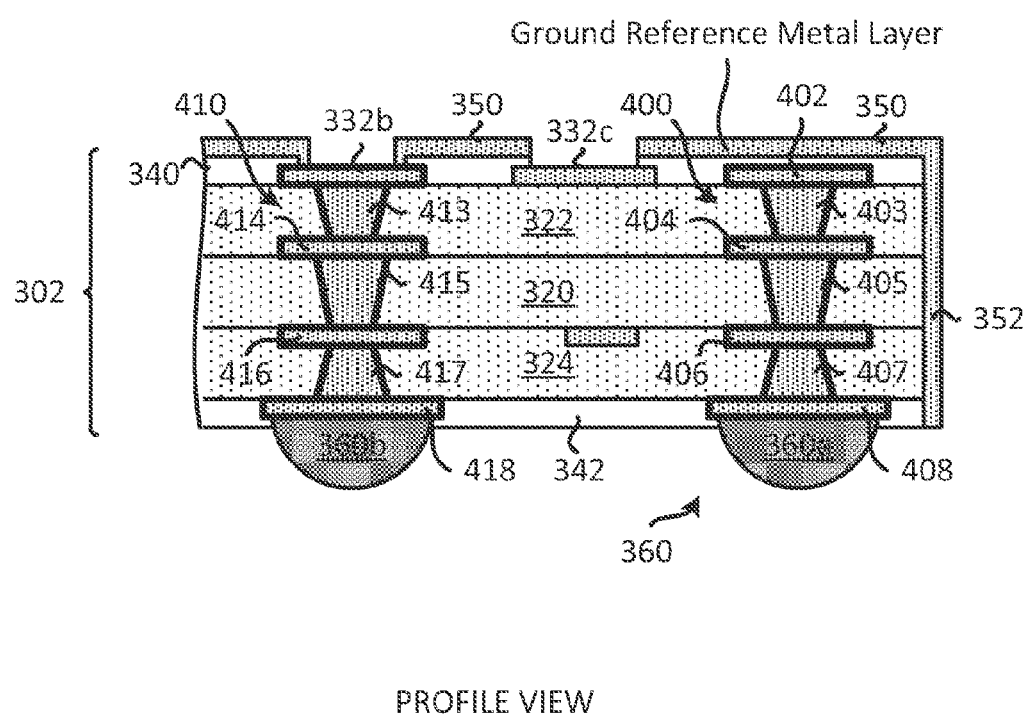
FIG. 4 illustrates a close view of a package substrate that includes stacks of interconnects, an interconnect on a solder resist layer, and an interconnect on a side portion of the package substrate.

FIG. 4 illustrates a close up profile view of the substrate 302. FIG. 4 illustrates that the substrate 302 includes a first stack of interconnects 400 first stack of first interconnects) and a second stack of interconnects 410 (e.g., second stack of second interconnects, third stack of third interconnects, fourth stack of fourth interconnects). The first stack of interconnects 400 may be a stack of interconnects from the set of first stacks of interconnects 380, as mentioned above. The second stack of interconnects 410 may be a stack of interconnects from the set of second stacks of interconnects 390, as mentioned above. In some implementations, a stack of interconnects is an arrangement and/or configuration of interconnects substantially arranged in a stack (e.g., vertical stack). A stack of interconnects does not need to be perfectly aligned in a stack (e.g., does not need to be perfectly vertically aligned). The stack of interconnects may be a stack of vias.

As shown in FIG. 4, the first stack of interconnects 400 includes interconnect 402, via 403, interconnect 404, via 405, interconnect 406, via 407, and/or interconnect 408. The interconnect 402 may be a pad (e.g., via pad) coupled to via 403. The interconnect 402 may be located on the second dielectric layer 322. The via 403 may be coupled to the interconnect 404. The interconnect 404 may be a pad (e.g., via pad). The via 403 and the interconnect 404 may be located in the second dielectric layer 322. The interconnect 404 may be coupled to the via 405. The via 405 may be located in the first dielectric layer 320. The via 405 may be coupled to interconnect 406. The interconnect 406 may be a pad. The interconnect 406 may be coupled to via 407. The interconnect 406 and the via 407 may be located in the third dielectric layer 324. The via 407 may be coupled to interconnect 408. The interconnect 408 may be a pad (e.g., via pad). The interconnect 408 may be located on the third dielectric layer 324. The interconnect 408 may be coupled to solder ball 360a. It is noted that a stack of interconnects (e.g., first stack of interconnects 400) may include more or less interconnects (e.g., more or less pads and/or vias). Thus, the first stack of interconnects 400 merely illustrates one example of a configuration of a stack of interconnects.

The first stack of interconnects 400 may be configured to provide a first electrical path for a first signal (e.g., non-reference ground signal, first power signal, first input/output signal). Different stacks of interconnects from the set of first stacks of interconnects 380 may be configured to provide different electrical paths for different first signals (e.g., first power signal, first input/output signal, second power signal, second input/output signal, etc.) As will be further illustrated and described in at least FIGS. 7 and 10, the set of first stacks of interconnects 400 may be positioned in the substrate 302 such that the first stacks of interconnects 400 are located at least partially within or near the periphery or perimeter of the substrate 302. In some implementations, the periphery of the substrate 302 includes an area and/or portion of the substrate 302 that is about within 300 microns (μm) or less of a side portion (e.g., side wall, side edge) of the substrate 302. In some implementations, the set of first stacks of interconnects 400 are stacks of interconnects located nearest the side interconnect 352.

The second stack of interconnects 410 may be a stack of interconnects from the set of second stacks of interconnects 390. The second stack of interconnects 410 may be configure to provide a second electrical path for a second signal (e.g., ground reference signal).

The second stack of interconnects 410 includes interconnect 412, via 413, interconnect 414, via 415, interconnect 416, via 417, and/or interconnect 418. The interconnect 412 may be a pad (e.g., via pad) coupled to via 413. The interconnect 412 may be located on the second dielectric layer 322. The via 413 may be coupled to interconnect 414. The interconnect 414 may be a pad (e.g., via pad). The via 413 and the interconnect 414 may be located in the second dielectric layer 322. The interconnect 414 may be coupled to the via 415. The via 415 may be located in the first dielectric layer 320. The via 415 may be coupled to interconnect 416. The interconnect 416 may be a pad. The interconnect 416 may be coupled to via 417. The interconnect 416 and the via 417 may be located in the third dielectric layer 324. The via 417 may be coupled to interconnect 418. The interconnect 418 may be a pad. The interconnect 418 may be located on the third dielectric layer 324. The interconnect 418 may be coupled to solder ball 360b. It is noted that a stack of interconnects (e.g., second stack of interconnects 410) may include more or less interconnects (e.g., more or less pads and/or vias). Thus, the second stack of interconnects 410 merely illustrates one example of a configuration of a stack of interconnects.

It is noted that the interconnect 408 and the interconnect 418 may be printed circuit board (PCB) side pads. The PCB side of the substrate is the side of substrate facing the PCB when the substrate is coupled to the PCB.

FIG. 4 illustrates that the second stack of interconnects 410 is coupled physically touching) to the surface interconnect 350. In some implementations, the second stack of interconnects 410 may be coupled (e.g., electrically coupled) to the surface interconnect 350 through a solder ball (e.g., solder ball 310b).

In some implementations, the use of stacked interconnects (e.g., stack of interconnects 400), the surface interconnect 350, and/or the side interconnect 352 provides several technical advantages. In one example, the use of a stack of interconnects, the surface interconnect 350, and/or the side interconnect 352 allows for the reduction in the number of solder balls and/or solder ball pads used in a package substrate. Specifically, the number of solder balls and/or solder ball pads configured to provide an electrical path for a ground reference signal can be reduced, due to the presence of the surface interconnect 350 and/or the side interconnect 352. In addition, solder balls and/or solder ball pads that would otherwise we configured to provide an electrical path for a ground reference signal, can now be used to provide at least one electrical path for at least one non-ground reference signal (e.g., power signal, input/output signal). Thus, a greater percentage of solder balls and/or solder ball pads (e.g., solder balls coupled to a printed circuit board) can be used for non-ground reference signals.

In some implementations, at least a majority of the solder balls and/or solder ball pads (e.g., solder balls coupled to a primed circuit board) are configured to provide at least one electrical path for at least one non-ground reference signal. In some implementations, a majority, or a substantial number (e.g., about 60 percent or more, 70 percent or more, 80 percent or more) of the solder ball and/or solder ball pads (e.g., solder balls from the set of solder balls 260) are configured to provide at least one electrical path for at least one non-ground reference signal.

Figure 5:
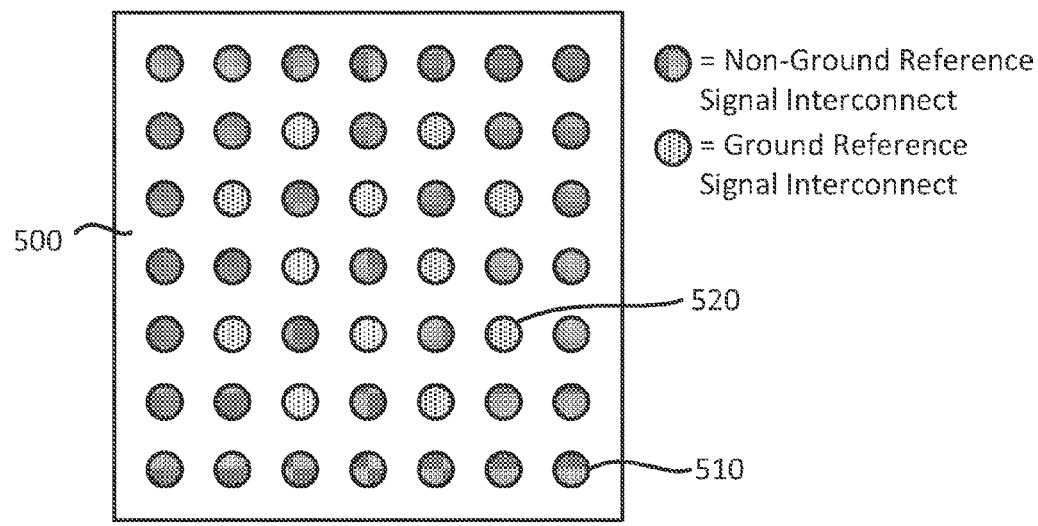
FIG. 5 illustrates a plan view of an arrangement of solder ball pads and/or solder balls.
Figure 6:
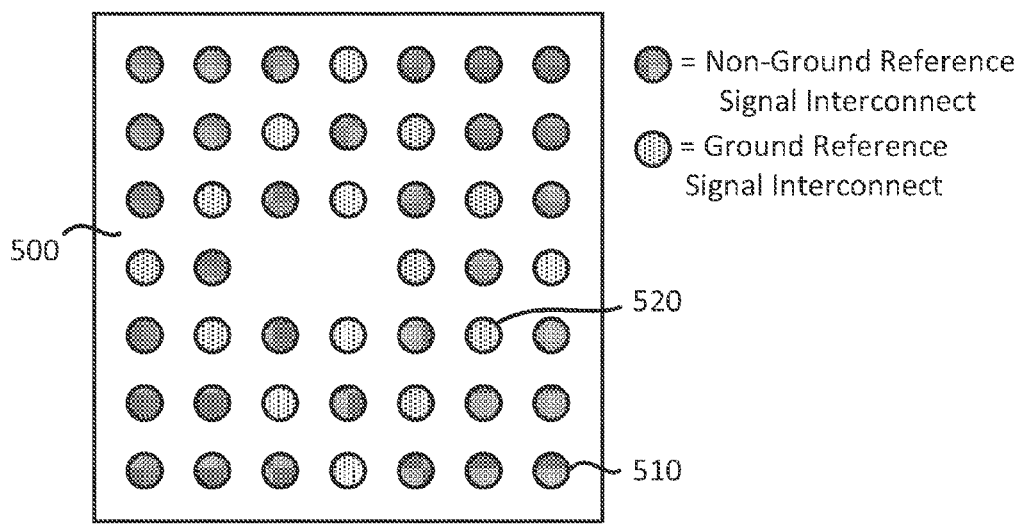
FIG. 6 illustrates a plan view of another arrangement of solder ball pads and/or solder balls.

FIGS. 5-6 illustrate examples of how solder balls and/or solder ball pads may be arranged in a substrate when stacks of interconnects (e.g., stack of interconnects 400), a surface interconnect (e.g., surface interconnect 350), and/or a side interconnect (e.g., side interconnect 352) are implemented in/on a substrate.

FIG. 5 illustrates a plan view of an arrangement of interconnects 510 and 520 in a substrate 500. The interconnect 510 may represent a solder ball and/or a solder ball pad that are configured to provide an electrical path for a non-ground reference signal. The interconnect 520 may represent a solder ball and/or a solder ball pad that are configured to provide an electrical path for a ground reference signal. As shown in FIG. 5, the set of interconnects 510 are positioned along the periphery or perimeter of the substrate 500 (e.g., at least partially within the periphery of the substrate 500). The set of interconnects 510 are arranged in an outer row of interconnects and/or an outer column of interconnects along the periphery, perimeter and/or edge of the substrate. FIG. 5 illustrates that a majority, or a substantial majority or percentage (e.g., about 60 percent or more, 70 percent or more, 80 percent or more) of the interconnects (e.g., solder balls, solder ball pads) are configured to provide an electrical path for a non-ground reference signal.

FIG. 6 illustrates a plan view of another arrangement of interconnects 510 and 520 in the substrate 500. FIG. 6 illustrates some interconnects removed from the substrate 500. In addition, FIG. 6 illustrates that some interconnects 520 (e.g., ground reference signal interconnect) may be at least partially located within the periphery, at perimeter, and/or near the edge of the substrate 500. For instance, an interconnect 520 may be located in an outer row of interconnects and/or an outer column of interconnects of the substrate 500.

FIGS. 5-6 illustrate a plan view of the substrate 500. The plan view of the substrate 500 may be from the die side perspective or the printed circuit board (PCB) side perspective. Thus, FIGS. 5-6 may represent die side interconnects (e.g., die side pads, die side solder balls) or PCB side interconnects (e.g., PCB side pads, PCB side solder balls) of a substrate (e.g., substrate 302). It is noted that in some implementations, another form of interconnect may be used. For example, the interconnects 510 and 520 may represent a conducting pillar (e.g., copper pillar). The conducting pillar may be used in conjunction with solder.

In some implementations, a die side pad and/or a PCB pad of a package substrate is a pad that is configured to couple to a solder (e.g., solder ball) and/or conducting post and/or pillar. The die side of the package substrate is the side of substrate facing the die when the die is coupled to the package substrate. The PCB side of the package substrate is the side of substrate facing the PCB when the package substrate is coupled to the PCB.

Having described how stacks of interconnects (e.g., stack of interconnects 400), a surface interconnect surface interconnect 350), and/or a side interconnect (e.g., side interconnect 352) provide advantages to the substrate, electrical properties of a substrate that includes stacks of interconnects, a surface interconnect, and/or a side interconnect.

FIG. 7 illustrates a plan view of the substrate 302 that includes the side interconnect 352. The substrate 302 includes several first stack of interconnects 400 as described above. FIG. 8 illustrates a profile view of an exemplary first stack of interconnects 400. Different stack of interconnects may have different number and configurations of interconnects (e.g., trace, pads, vias). The first stack of interconnects 400 may be configured to provide an electrical path for a signal (e.g., power signal, input/output signal). Different first stack of interconnects 400 may provide an electrical path for different signals (e.g., non-ground reference signals).

As shown in FIG. 7, the several first stacks of interconnects 400 may be positioned in the substrate 302 such that the first stacks of interconnects 400 are at least partially located within, at or near the periphery or perimeter of the substrate 302. In some implementations, the periphery of the substrate 302 includes an area and/or portion of the substrate 302 that is about within 300 microns (μm) or less of a side portion (e.g., side wall, side edge) of the substrate 302. In some implementations, the first stacks of interconnects are stacks of interconnects located nearest the side interconnect 352. The first stacks of interconnects 400 may be arranged in an outer row and/or outer column of stacks of interconnects. The side interconnect 352 is configured to provide an electrical path for a ground reference signal. In some implementations, placing the first stacks of interconnects 400 near and/or adjacent to the side interconnect 352, provides several technical advantages to an integrated device package (e.g., integrated circuit device).

FIG. 9 conceptually illustrates the electrical properties of a stack of interconnects near metal layer. The electrical properties described in FIG. 9 may be applied to any interconnects (e.g., stack of interconnects) configured to provide an electrical path for a first signal (e.g., power signal, input/output signal) that is near another interconnect configured to provide an electrical path for a ground reference signal described in the present disclosure.

FIG. 9 illustrates a first interconnect 902, a second interconnect 904, and a third interconnect 910. The first interconnect 902 and the second interconnect 904 may each represent a stack of interconnects (e.g., first stack of interconnects 400). The first interconnect 902 and the second interconnects 904 may each be configured to provide a respective electrical path for a non-ground reference signal (e.g., first power signal, first input/output signal, second input/output signal). The third interconnect 910 may represent the side interconnect 352. The third interconnect 910 is configured to provide an electrical path for a ground reference signal.

As shown in FIG. 9, the presence of the third interconnect 910 near the first interconnect 902 and the second interconnect 904 helps improve the isolation and insertion loss between the first interconnect 902 and the second interconnect 904. As shown, the electric and magnetic fields between conductors are tightly coupled and confined, leading to improved signal delivery characteristics in the first interconnect 902 and second interconnect 904. As shown in FIG. 9, the signal that traverses through the first interconnect 902 does not interfere (or minimally interferes) with the signal (e.g., first signal) that traverses the second interconnect 904. Similarly, the signal (e.g., second signal) that traverses the second interconnect 904 does not interfere (or minimally interferes) with the signal that traverses the first interconnect 902. Since the first signal and the second signal do not interfere or mix with other, the integrity and quality of each respective signal (e.g., first signal, second signal) is preserved, resulting in improved signal performance in the integrated device package (e.g., integrated circuit device). Without the presence of the third interconnect 910, the respective signals that traverse the first interconnect 902 and the second interconnect 904 would substantially interfere with each other resulting in low quality signals in the first interconnect 902 and the second interconnect 904. Thus, the third interconnect 910 helps isolate (e.g., helps at least partially isolate) the first signal traversing in the first interconnect 902 from the second signal traversing in the second interconnect 904, and vice-versa.

In some implementations, in order to achieve the above described signal isolation, the first interconnect 902 and the second interconnect 904 have to be near enough the third interconnect 910. In some implementations, a first spacing between the third interconnect 910 and the first interconnect 902 is less than a second spacing between the first interconnect 902 and the second interconnect 904. Similarly, in some implementations, a third spacing between the third interconnect 910 and the second interconnect 904 is less than the second spacing between the first interconnect 902 and the second interconnect 904. Thus, in some implementations, the first interconnect 902 may have to be closer to the third interconnect 910 than the second interconnect 904 in order to get the desired signal isolation as described above. Similarly, the second interconnect 904 may have to be closer to the third interconnect 910 than the first interconnect 902 in order to get the desired signal isolation as described above.

FIG. 9 shows that even though the first interconnect 902 is not directly touching the third interconnect 910, there is at least partial electrical coupling by electric field (as indicated by the arrows), between the first interconnect 902 and the third interconnect 910 when a signal (e.g., first signal) traverses the first interconnect 902. Similarly, even though the second interconnect 904 is not directly touching the third interconnect 910, there is at least partial electrical coupling by electric field (as indicated by the arrows), between the second interconnect 904 and the third interconnect 910 when a signal (e.g., second signal) traverses the second interconnect 904. Thus, in some implementations, the first interconnect 902 is at least partially coupled to the third interconnect 910 (e.g., by an electric field) when a signal (e.g. first signal) traverses the first interconnect 902, even though the first interconnect 902 is free of direct contact with the third interconnect 910. Similarly, in some implementations, the second interconnect 904 is at least partially coupled to the third interconnect 910 (e.g., by an electric field) when a signal (e.g., second signal) traverses the second interconnect 904, even though the second interconnect 904 is free of direct contact with the third interconnect 910.

FIG. 9 illustrates that the third interconnect 910 is a single contiguous piece of interconnect. The third interconnect 910 may be coupled by an electric field to two or more interconnects (e.g., interconnects 902, 904). However, in some implementations, the third interconnect 910 may be include several pieces of interconnects. Such an instance is described below in FIG. 11.

Figure 10:
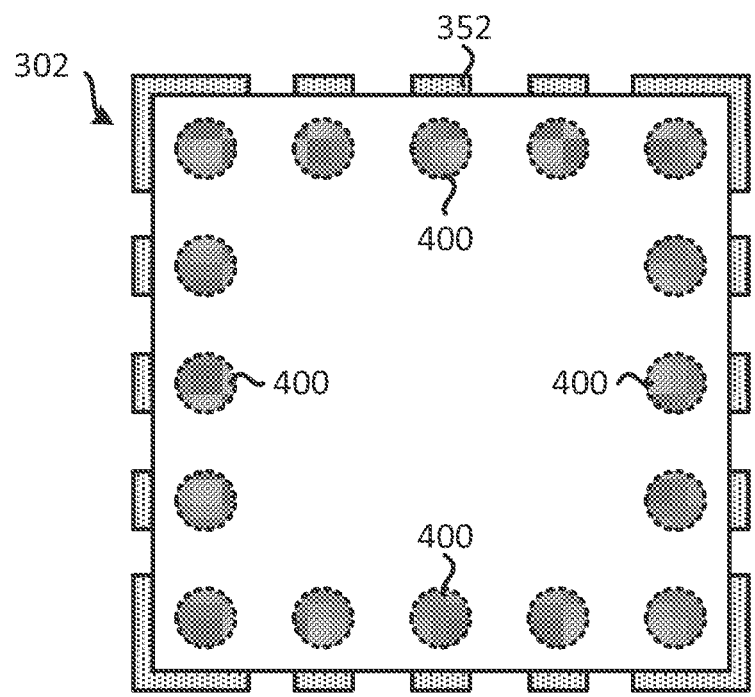
FIG. 10 illustrates a plan view of a package substrate that includes stacks of interconnects and a patterned interconnect on a side portion of the package substrate.

As mentioned above, a side interconnect 352 may be patterned. FIG. 10 illustrates a substrate 302 that includes a patterned side interconnect 352, where the patterned side interconnect 352 is configured to provide an electrical for a ground reference signal. As shown in FIG. 10, the substrate 302 includes several first stacks of interconnects 400 that may be positioned in the substrate 302 such that the first stacks of interconnects 400 are at least partially located within, at or near the periphery or perimeter of the substrate 302. In some implementations, the first stacks of interconnects are stacks of interconnects located nearest the side interconnect 352. In some implementations, the periphery of the substrate 302 includes an area and/or portion of the substrate 302 that is about within 300 microns (μm) or less of a side portion (e.g., side wall, side edge) of the substrate 302. The first stacks of interconnects 400 may be arranged in an outer row and/or outer column of stacks of interconnects. The side interconnect 352 is patterned in such as way that a respective portion of the side interconnect 352 is near or adjacent to a respective first stack of interconnects 400. In some implementations, patterning the side interconnect 352 reduces material and thus reduces the cost of fabricating the substrate and/or the integrated device package.

Moreover, the side interconnect 352 may be patterned to improve isolation of the signals that are nearby. In addition, the side interconnect 352 may be patterned to provide a resonant structure to improve the performance of the device (e.g., die). In some implementations, the side interconnect 352 may be patterned to create empty space or area in the package substrate to improve the performance of the device. In some implementations, the side interconnect 352 may be patterned and partitioned to create separate interconnects that are configured to provide several electrical paths for several different ground reference signals. For example, the side interconnect 352 may be patterned and partitioned into (1) a first side interconnect configured to provide a first electrical path for a first ground reference signal (e.g., general ground reference signal), (2) a second side interconnect configured to provide a second electrical path for a second ground reference signal (e.g., analog ground reference signal), (3) a third side interconnect configured to provide a third electrical path for a third ground reference signal (e.g., digital ground reference signal), and (4) a fourth side interconnect configured to provide a fourth electrical path for a fourth ground reference signal (e.g., radio frequency (RF) ground reference signal). In some implementations, one or more of the above side interconnect are not physically touching each other.

Figure 11:
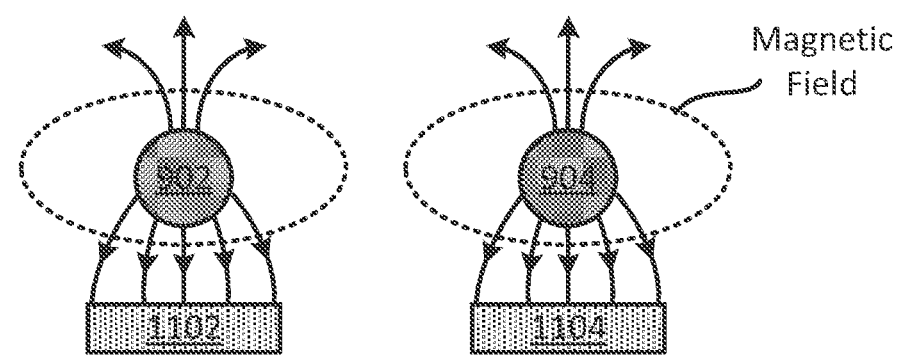
FIG. 11 illustrates electrical properties of four interconnects.

FIG. 11 conceptually illustrates the electrical properties of stacks of interconnects near metal layers. The electrical properties described in FIG. 11 may be applied to any interconnects (e.g., stack of interconnects) configured to provide an electrical path for a first signal (e.g., power signal, input/output signal) that is near another interconnect configured to provide an electrical path for a ground reference signal described in the present disclosure.

FIG. 11 illustrates the first interconnect 902, the second interconnect 904, a third interconnect 1102, and a fourth interconnect 1104. The first interconnect 902 and the second interconnect 904 may each represent a stack of interconnects (e.g., first stack of interconnects 400). The first interconnect 902 and the second interconnect 904 may each be configured to provide a respective electrical path for a non-ground reference signal (e.g., first power signal, first input/output signal, second input/output signal). The third interconnect 1102 and the fourth interconnect 1104 may represent portions of the side interconnect 352. The third interconnect 1102 and the fourth interconnect 1104 are configured to provide an electrical path for a ground reference signal.

As shown in FIG. 11, the presence of the third interconnect 1102 near the first interconnect 902, and the presence of the fourth interconnect 1104 near the second interconnect 904 help improve the isolation and insertion loss between the first interconnect 902 and the second interconnect 904. As shown, the electric and magnetic fields between conductors are tightly coupled and confined, leading to improved signal delivery characteristics in the first interconnect 902 and the second interconnect 904. As shown in FIG. 11, the signal that traverses through the first interconnect 902 does not interfere (or minimally interferes) with the signal (e.g., first signal) that traverses the second interconnect 904. Similarly, the signal (e.g., second signal) that traverses the second interconnect 904 does not interfere (or minimally interferes) with the signal that traverses the first interconnect 902. Since the first signal and the second signal do not interfere or mix with other, the integrity and quality of each respective signal (e.g., first signal, second signal) is preserved, resulting in improved signal performance in the integrated device package (e.g., integrated circuit device). Without the presence of the third interconnect 1102 and/or the fourth interconnect 1104, the respective signals that traverse the first interconnect 902 and the second interconnect 904 would substantially interfere with each other resulting in low quality signals in the first interconnect 902 and second interconnect 904. Thus, the third interconnect 1102 and the fourth interconnect 1104 help isolate (e.g., helps at least partially isolate) the first signal traversing in the first interconnect 902 from the second signal traversing in the second interconnect 904, and vice-versa.

In some implementations, in order to achieve the above described signal isolation, the first interconnect 902 and the second interconnect 904 have to be near enough the respective third interconnect 1102 and the respective fourth interconnect 1104. In some implementations, a first spacing between the third interconnect 1102 and the first interconnect 902 is less than a second spacing between the first interconnect 902 and the second interconnect 904. Similarly, in some implementations, a third spacing between the fourth interconnect 1104 and the second interconnect 904 is less than the second spacing between the first interconnect 902 and the second interconnect 904. Thus, in some implementations, the first interconnect 902 may have to be closer to the third interconnect 1102 than the second interconnect 904 in order to get the desired signal isolation as described above. Similarly, the second interconnect 904 may have to be closer to the fourth interconnect 1104 than the first interconnect 902 in order to get the desired signal isolation as described above.

FIG. 11 shows that even though the first interconnect 902 is not directly touching the third interconnect 1102, there is at least partial electrical coupling by electric field (as indicated by the arrows), between the first interconnect 902 and the third interconnect 1102 when a signal (e.g., first signal) traverses the first interconnect 902. Similarly, even though the second interconnect 904 is not directly touching the fourth interconnect 1104, there is at least partial electrical coupling by electric field (as indicated by the arrows), between the second interconnect 904 and the fourth interconnect 1104 when a signal (e.g., second signal) traverses the second interconnect 904. Thus, in some implementations, the first interconnect 902 is at least partially coupled to the third interconnect 1102 (e.g., by an electric field) when a signal (e.g. first signal) traverses the first interconnect 902, even though the first interconnect 902 is free of direct contact with the third interconnect 1102. Similarly, in some implementations, the second interconnect 904 is at least partially coupled to the fourth interconnect 1104 (e.g., by an electric field) when a signal (e.g., second signal) traverses the second interconnect 904, even though the second interconnect 904 is free of direct contact with the fourth interconnect 1104.

Figure 12:
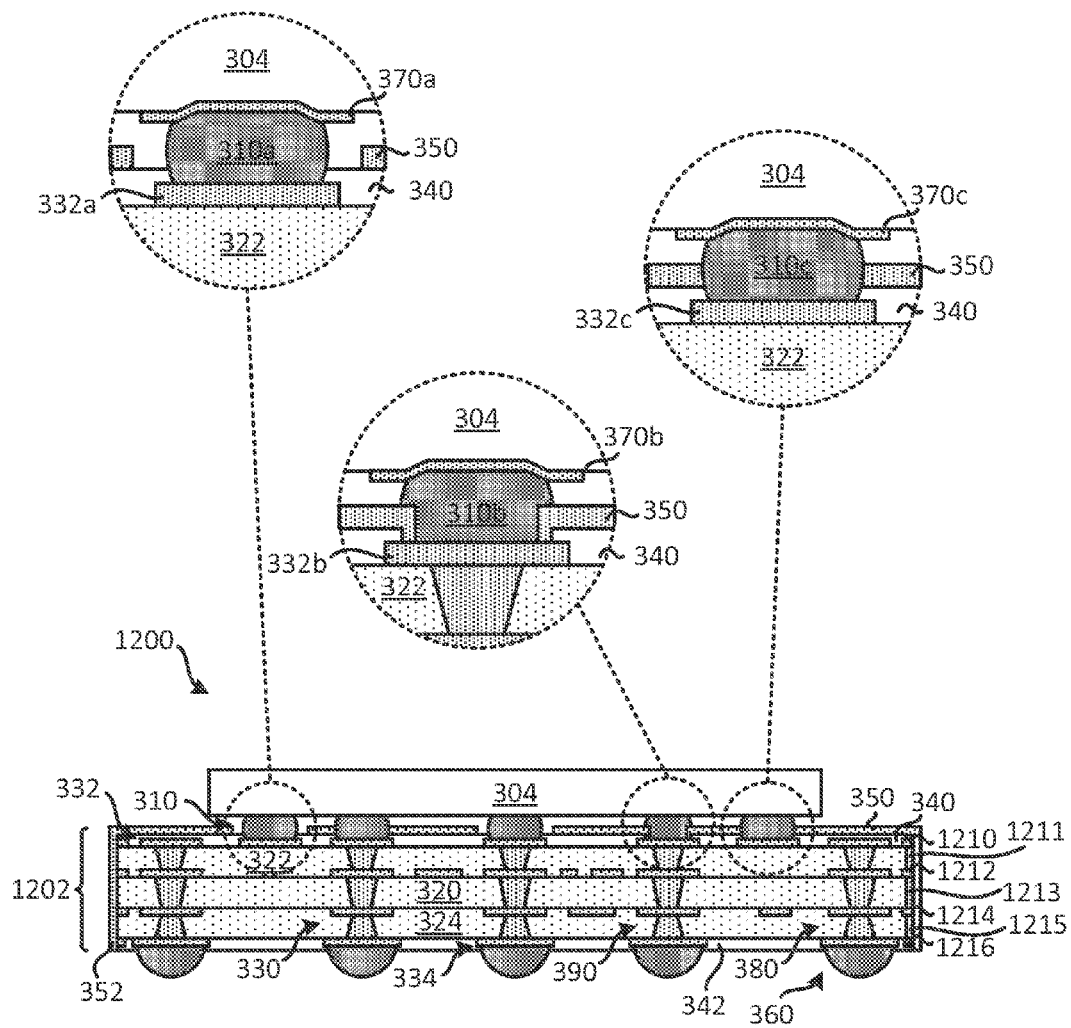
FIG. 12 illustrates an integrated device package comprising a package substrate that includes stacks of interconnects, an interconnect on a solder resist layer, edge interconnects, and an interconnect on a side portion of the package substrate.

Exemplary Integrated Device Package Comprising Substrate with Stacks of interconnects, Interconnect on Solder Resist Layer and interconnect on Side Portion of Substrate FIG. 12 illustrates a profile view of an integrated device package 1200 (e.g., integrated circuit device) that includes a substrate 1202 and the die 304. The die 304 may be a bare die. The die 304 is coupled to the substrate 1202 through the first set of solder balls 310. The first set of solder balls 310 includes solder ball 310a, solder ball 310b, and solder ball 310c.

The substrate 1202 may be a package substrate and/or an interposer. The substrate 1202 may be similar to the substrate 302 described above in FIG. 3. The die 304 may be coupled to the substrate 1202 in a similar manner as how the die 304 is coupled to the substrate 302 as described above in FIG. 3.

Figure 13:
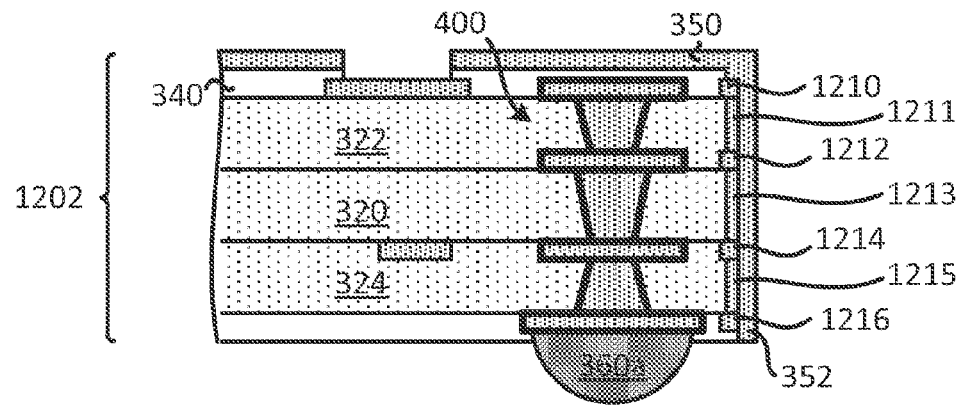
FIG. 13 illustrates a close view of a package substrate that includes stacks of interconnects, an interconnect on a solder resist layer, edge interconnects, and an interconnect on a side portion of the package substrate.
Figure 17:
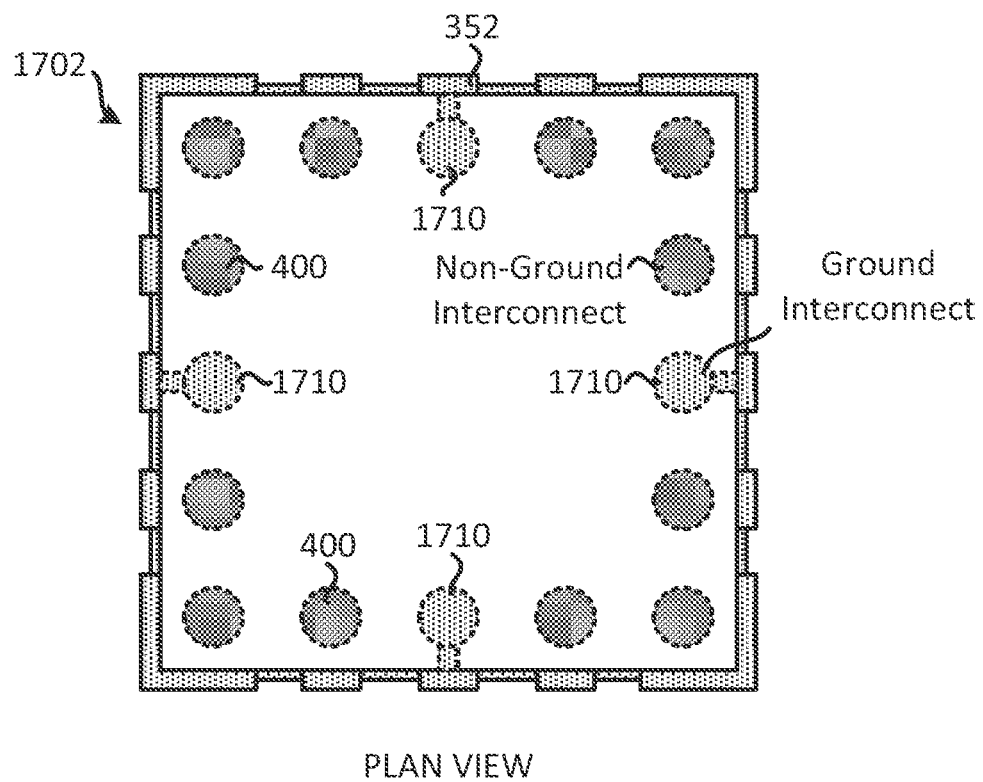
FIG. 17 illustrates a plan view of another package substrate that includes a stack of interconnects coupled to an interconnect on a side portion of the package substrate.

FIG. 12 illustrates that the substrate 1202 includes several edge interconnects 1210, 1211, 1212, 1213, 1214, 1215, and 1216 that are located at the side edge of the substrate 1202. FIG. 17 illustrates a close up view of an edge of the substrate 1202 of FIG. 12, As shown in FIG. 12 and FIG. 13, the edge interconnect 1210 is located on the second dielectric layer 322. The edge interconnect 1212 is located in the second dielectric layer 322. The edge interconnect 1214 is located in the third dielectric layer 324. The edge interconnect 1216 is located on the third dielectric layer 324. One or more of the edge interconnects 1210, 1211, 1212, 1213, 1214, 1215 and/or 1216 may be optional. In some implementations, the edge interconnects 1210, 1211, 1212, 1213, 1214, 1215 and/or 1216 help in the forming of the side interconnect 352 during a fabrication of the substrate 1202. For example, one or more of the edge interconnects 1210, 1211, 1212, 1213, 1214, 1215, and/or 1216 help create the side interconnect 352 (e.g., patterned side interconnect) during a plating process of the substrate 1202. Thus, in some implementations, selectively forming edge interconnects along the edge of the substrate 1202 (e.g., edge of substrate prior to forming the side interconnect 352) helps define the pattern of the side interconnect 352 that will be formed on the substrate 1202.

The edge interconnects (e.g., edge interconnect 1211) may be part of the side interconnects (e.g., side interconnect 352), and vice-versa. The edge interconnects may be coupled to the surface interconnect 350. In some implementations, when edge interconnects are used, the side interconnect 352 may be optional.

In some implementations, the one or more edge interconnects (e.g., edge interconnect 1210) may be coupled to a stack of interconnects configured to provide an electrical path for a ground reference signal. Such an example is illustrated and described below in at least in FIGS. 17-19.

Figure 14:
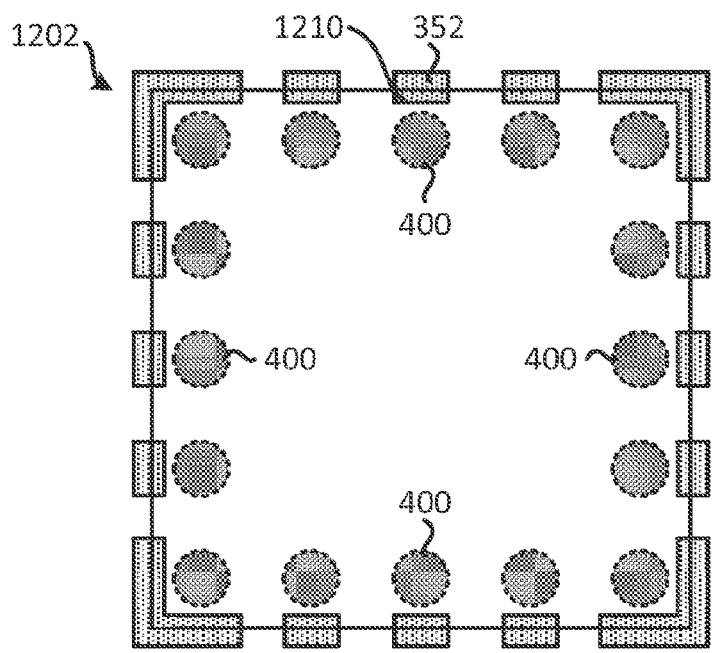
FIG. 14 illustrates a plan view of a package substrate that includes stacks of interconnects, edge interconnects, and an interconnect on a side portion of the package substrate.

FIG. 14 illustrates a plan view of the substrate 1202 that includes the side interconnect 352 and several edge interconnects (e.g., edge interconnect 1210). The substrate 1202 includes several first stack of interconnects 400 as described above. Different stack of interconnects may have different number and configurations of interconnects (e.g., trace, pads, vias). The first stack of interconnects 400 may be configured to provide an electrical path for a signal (e.g., power signal, input/output signal). Different first stack of interconnects 400 may provide an electrical path for different signals (e.g., non-ground reference signals). As shown in FIG. 14, the substrate 1202 includes several first stacks of interconnects 400 that may be positioned in the substrate 1202 such that the first stacks of interconnects 400 are at least partially located at or near the periphery or perimeter of the substrate 1202. In some implementations, the periphery of the substrate 1202 includes an area and/or portion of the substrate 1202 that is about within 300 microns (μm) or less of a side portion (e.g., side wall, side edge) of the substrate 1202. The first stacks of interconnects 400 may be arranged in an outer row and/or outer column of stacks of interconnects. In some implementations, the first stacks of interconnects 400 are stacks of interconnects located nearest the edge interconnects and/or the side interconnect 352. The side interconnect 352 is patterned in such as way that a respective portion of the side interconnect 352 is near or adjacent to a respective first stack of interconnects 400. In some implementations, by placing the first stacks of interconnects 400 near and/or adjacent to the edge interconnects and/or the side interconnect 352, provides several technical advantages to an integrated device package (e.g., integrated circuit device).

Figure 15:
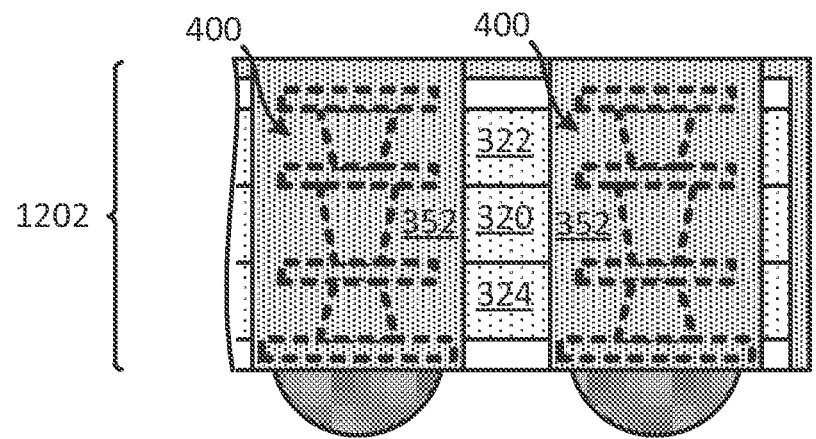
FIG. 15 illustrates a profile view of a package substrate that includes a patterned interconnect on a side portion of the package substrate.

FIG. 15 illustrates a profile view of a portion of the substrate 1202. As shown in FIG. 15, the side interconnect 352 is formed in such a pattern that a first portion of the side interconnect 352 is substantially aligned with a stack of interconnects 400, and a second portion of the side interconnect 352 is substantially aligned with another stack of interconnects 400.

Figure 16:
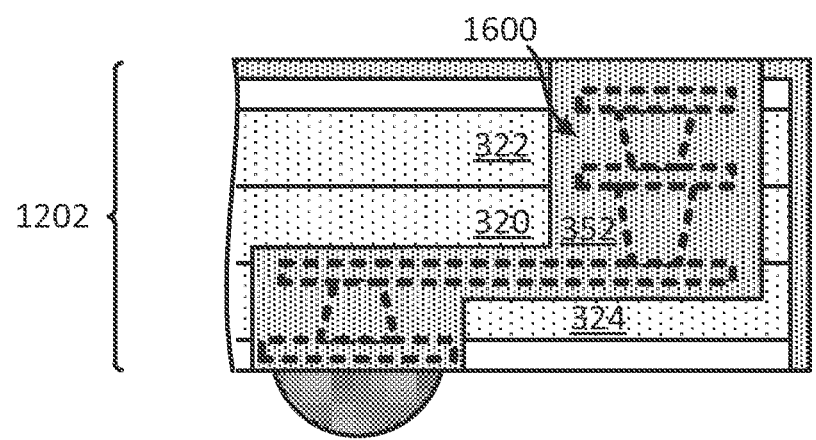
FIG. 16 illustrates a profile view of a package substrate that includes another patterned interconnect on a side portion of the package substrate.

FIG. 16 illustrates a profile view of another portion of the substrate 1202, The substrate 1202 includes a stack of interconnects 1600 (e.g., first stack of first interconnects) with a different configuration and arrangement of interconnects. The stack of interconnects 1600 is configured to provide an electrical path for a non-ground reference signal (e.g., power signal, input/output signal). FIG. 16 illustrates that the side interconnect 352 is formed in such a pattern that a third portion of the side interconnect 352 is substantially aligned with the stack of interconnects 1600.

As mentioned above, a stack of interconnects may be coupled (e.g., electrically coupled) to a side interconnect 352. FIG. 17 illustrates a substrate 1702 that includes several stacks of interconnects 400 and several stacks of interconnects 1710 (e.g., first stack of first interconnects, second stack of second interconnects, third stack of third interconnects, fourth stack of fourth interconnects). The stacks of interconnects 1710 is coupled to (e.g., directly touching) the side interconnect 352. In some implementations, the stacks of interconnects 1710 is coupled to the side interconnect 352 through one or more edge interconnects (e.g., edge interconnect 1210). As shown in FIG. 17, the stacks of interconnects 400 and the stacks of interconnects 1710 may be positioned in the substrate 1702 such that the stacks of interconnects 400 and stacks of interconnects 2110 are at least partially located within, at or near the periphery or perimeter of the substrate 1202 (e.g., located in an outer row and/or an outer column of stacks of interconnects). In some implementations, the stacks of interconnects 400 and 1710 are stacks of interconnects located nearest the side interconnect 352. The side interconnect 352 is patterned in such as way that a respective portion of the side interconnect 352 is near or adjacent to a respective first stack of interconnects 400.

In some implementations, at least a majority of the stacks of interconnects near the periphery or perimeter of the substrate 1202 are stacks of interconnects that are configured to provide at least one electrical path for a non-ground reference signal (e.g., power signal, input/output signal). For example, a majority, or a substantial number or percentage of the stacks of interconnects (e.g., about 60 percent or more, 70 percent or more, 80 percent or more) at least partially within the periphery or perimeter of the substrate 1202 are stacks of interconnects that are configured to provide at least one electrical path for a non-ground reference signal (e.g., power signal, input/output signal).

Figure 18:
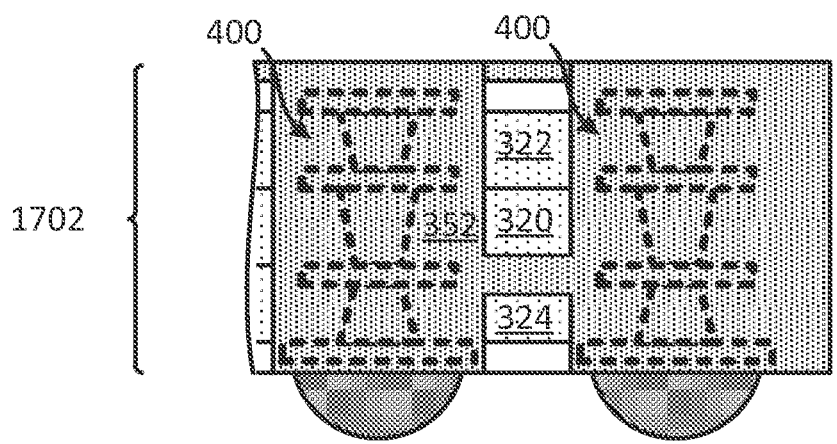
FIG. 18 illustrates a profile view of a package substrate that includes a patterned interconnect on a side portion of the package substrate.

FIG. 18 illustrates a profile view of the substrate 1702 where a first portion of the side interconnect 352 is coupled to a second portion of the side interconnect 352 through a lateral side interconnect that connects the first portion and the second portion of the side interconnect 352.

FIGS. 15-18 illustrate examples of a side interconnect (e.g., side interconnect 352) that is patterned to at least substantially mirror or mimic the form of nearby interconnects (e.g., stacks of interconnects, interconnect layout). In some implementations, the side interconnect may exactly mirror or mimic the form of the nearby interconnects. As shown in FIGS. 15-18, in some implementations, the side interconnect may be patterned to be similar but not necessarily identical to the nearby interconnects. In some implementations, simpler shapes may be used to mirror or mimic more complicated shapes or structures. For example, a rectangular shape portion of the side interconnect may be used to mirror or mimic the shape of a stack of interconnects comprising vias and pads.

Figure 19:
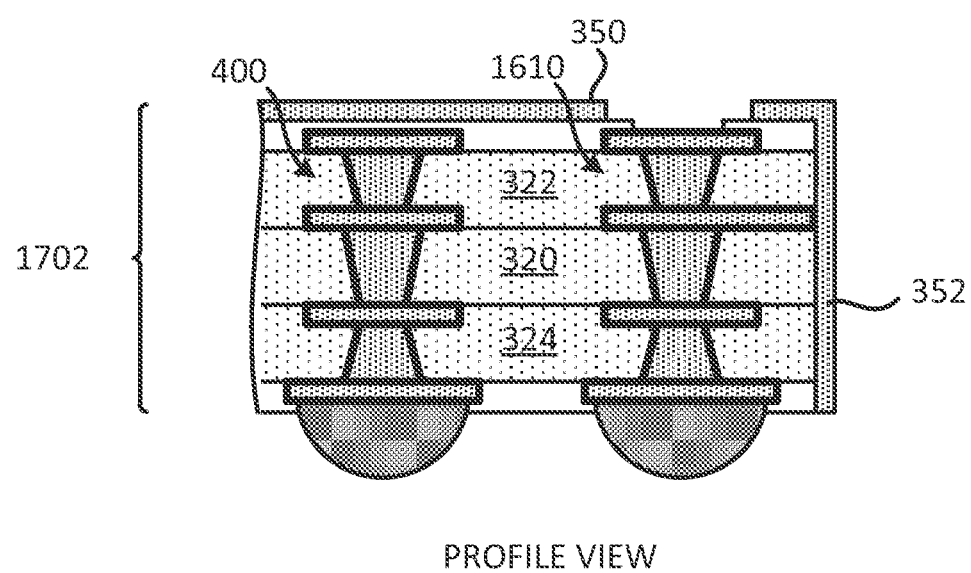
FIG. 19 illustrates a profile view of a package substrate that includes a stack of interconnects coupled to an interconnect on a side portion of the package substrate.

FIG. 19 illustrates a profile view of the stack of interconnects 400 and the stack of interconnects 1710 in the substrate 1702. The stack of interconnects 1710 is coupled to the side interconnect 352. Different implementations may provide stack of interconnects 400 and stack of interconnects 1710 with different configurations and/or arrangement of interconnects. For example, the stack of interconnects 1710 may be coupled to the surface interconnect 350, either directly or indirectly (e.g., through a solder ball).

It is noted that the side interconnect 352 may be coupled (e.g., touching) the surface interconnect 350. In some implementations, the side interconnect 352 does not touch or directly touch the surface interconnect 350.

Exemplary Interconnect on Solder Resist Layer of a Substrate

Figure 20:
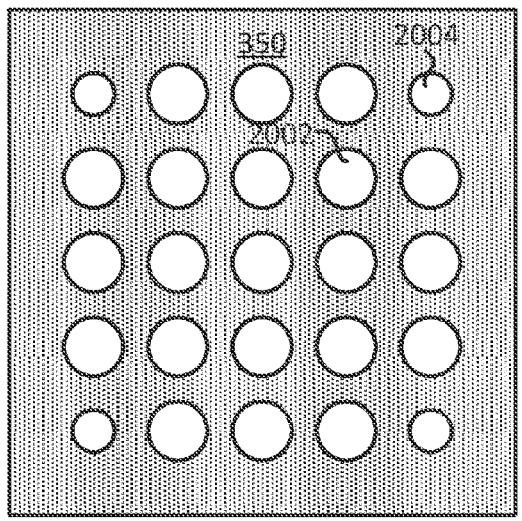
FIG. 20 illustrates a plan view of an interconnect on a solder resist layer.

FIG. 20 illustrates a cross sectional plan view of the surface interconnect 350 of on a solder resist layer of a substrate. The surface interconnect 350 may be configured to provide an electrical path for a ground reference signal. The surface interconnect 350 includes a first set of openings 2002, and a second set of openings 2004. The first set of openings 2002 may include one or more openings (e.g., cavities), The second set of openings 2004 may include one or more openings. The openings (e.g., cavities) in the first set of openings 2002 have a first dimension (e.g., first diameter, first width). The openings in the second set of openings 2004 have a second dimension (e.g., first diameter, first width) that is less than the first dimension.

Figure 21:
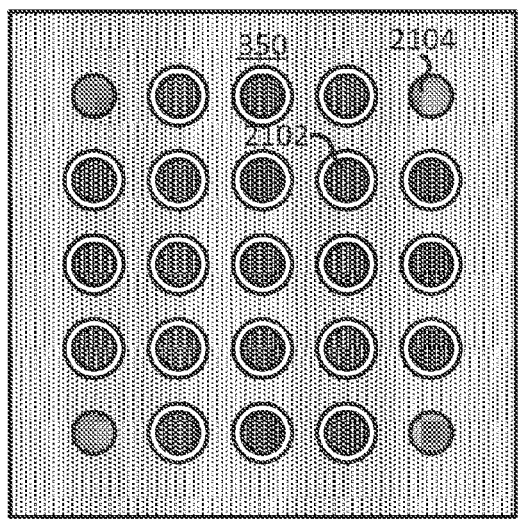
FIG. 21 illustrates a plan view of an interconnect on a solder resist layer, where solder balls are placed in cavities of the interconnect.

FIG. 21 illustrates a cross sectional plan view of the surface interconnect 350 after a set of solder balls are positioned in some or all of the openings of the surface interconnect 350. The set of solder balls may be solder balls that couple a die (e.g., die 304) to a substrate (e.g., substrate 302). FIG. 21 illustrates a first set of solder balls 2102 that are positioned in the first set of openings 2002. As shown in FIG. 21, the first set of solder hails 2102 do not directly touch (e.g., not in contact with) the surface interconnect 350. In some implementations, the first set of solder balls 2102 is configured to provide at least one first electrical path for at least one first signal (e.g., first power signal, first input/output signal, second input/output signal, etc. . . . ).

FIG. 21 also illustrates a second set of solder balls 2104 that are positioned in the first set of openings 2004. As shown in FIG. 21, the second set of solder balls 2104 are coupled to (e.g., directly touch, in contact with) the surface interconnect 350. In some implementations, the second set of solder balls 2104 is configured to provide at least one second electrical path for at least one second signal (e.g., first non-ground reference signal). Thus, in some implementations, some or all of the solder balls from the second set of solder ball 2104 may be configured to provide an electrical path for different signals (e.g., non-ground reference signals).

Figure 22:
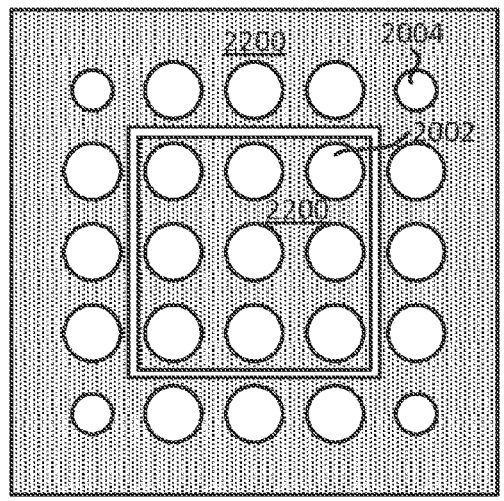
FIG. 22 illustrates a plan view of a patterned interconnect on a solder resist layer.
Figure 23:
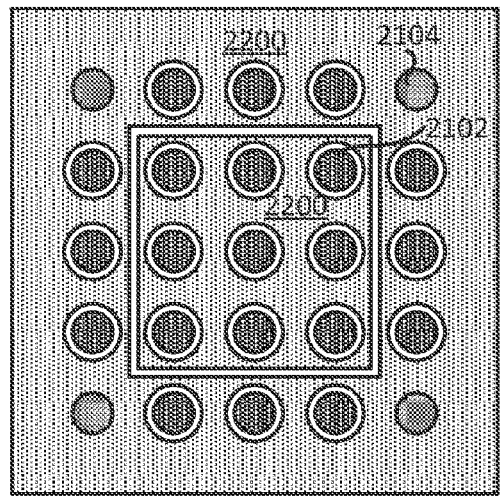
FIG. 23 illustrates a plan view of a patterned interconnect on a solder resist layer, where solder balls are placed in cavities of the interconnect.

As mentioned above, the surface interconnect 350 may be a patterned metal layer that includes several surface interconnects. FIGS. 22-23 illustrate an example of a patterned surface interconnect 2200. The patterned surface interconnect 2200 may replace the surface interconnect 350 described in the present disclosure. The patterned surface interconnect 2200 is merely an example of a patterned surface interconnect, Thus, different implementations may utilize a patterned surface interconnect with a different design and/or pattern.

FIG. 22 illustrates a cross sectional plan view of the patterned surface interconnect 2200. The patterned surface interconnect 2200 includes a first set of openings 2002, and a second set of openings 2004. The first set of openings 2002 may include one or more openings (e.g., cavities). The second set of openings 2004 may include one or more openings. The openings (e.g., cavities) in the first set of openings 2002 have a first dimension (e.g., first diameter, first width). The openings in the second set of openings 2004 have a second dimension (e.g., first diameter, first width) that is less than the first dimension.

FIG. 23 illustrates a cross sectional plan view of the patterned surface interconnect 2200 after a set of solder balls are positioned in some or all of the openings of the patterned surface interconnect 2200. The set of solder balls may be solder balls that couple a die (e.g., die 304) to a substrate (e.g., substrate 302). FIG. 23 illustrates a first set of solder balls 2102 that are positioned in the first set of openings 2002. As shown in FIG. 23, the first set of solder balls 2102 do not directly touch (e.g., not in contact with) the patterned surface interconnect 2200. In some implementations, the first set of solder balls 2102 is configured to provide at least one first electrical path for at least one first signal (e.g., first ground reference signal).

FIG. 23 also illustrates a second set of solder balls 2104 that are positioned in the first set of openings 2004. As shown in FIG. 23, the second set of solder balls 2104 are coupled to (e.g., directly touch, in contact with) the patterned surface interconnect 2200, in some implementations, the second set of solder balls 2104 is configured to provide at least one second electrical path for at least one second signal (e.g., first power signal, first input/output signal, second input/output signal, etc. . . . ). Thus, in some implementations, some or all of the solder balls from the second set of solder ball 2104 may be configured to provide an electrical path for different signals (e.g., non-ground reference signals).

The surface interconnect (e.g., patterned surface interconnect 2200) is patterned to at least substantially mirror or mimic the design and/or form of nearby interconnects (e.g., top level interconnects of a package substrate, interconnects of the die, interconnect layout of the package substrate and/or interconnects layout of a die). In some implementations, a top level interconnect of a package substrate is at least one interconnect in the package substrate that is nearest a top surface of the package substrate. In some implementations, a top level interconnect of a package substrate is at least one metal layer and/or at least one electrically conductive layer in the package substrate that is nearest the top surface of the package substrate. In some implementations, the surface interconnect may exactly mirror or mimic the design and/or form of the nearby interconnects. In some implementations, the surface interconnect may be patterned to be similar but not necessarily identical to the nearby interconnects. In some implementations, simpler patterns and/or shapes may be used to mirror or mimic more complicated design, shapes and/or layouts.

The surface interconnect 2200 may be patterned to improve isolation of the signals that are nearby. In addition, the surface interconnect 2200 may be patterned to provide a resonant structure to improve the performance of the device (e.g., die). In some implementations, the surface interconnect 2200 may be patterned to create empty space or area in the package substrate to improve the performance of the device. In some implementations, the surface interconnect 2200 may be patterned and partitioned to create separate interconnects that are configured to provide several electrical paths for several different ground reference signals. For example, the surface interconnect 2200 may be patterned and partitioned into (1) a first surface interconnect configured to provide a first electrical path for a first ground reference signal (e.g., general ground reference signal), (2) a second surface interconnect configured to provide a second electrical path for a second ground reference signal (e.g., analog ground reference signal), (3) a third surface interconnect configured to provide a third electrical path for a third ground reference signal digital ground reference signal), and (4) a fourth surface interconnect configured to provide a fourth electrical path for a fourth ground reference signal (e.g., radio frequency (RF) ground reference signal). In some implementations, one or more of the above surface interconnects are not physically touching each other.

Figure 24:
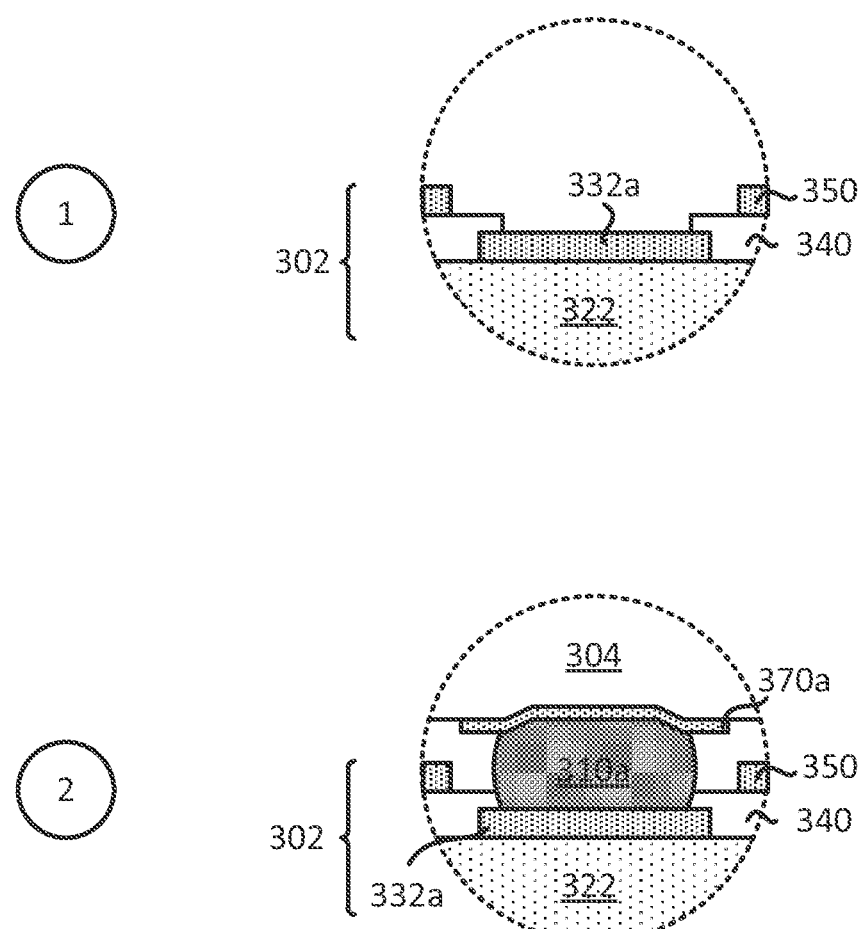
FIG. 24 illustrates a close up view of a portion of a package substrate during a sequence of a die being coupled to a package substrate that includes an interconnect on a solder resist layer.

Exemplary Coupling of Die to Substrate Comprising Interconnect on Solder Resist Layer FIG. 24 illustrates a close up view of a sequence of coupling (e.g., mounting) a die to a substrate. Stage 1 of FIG. 24 illustrates a close up view of a portion of the substrate 302 that includes the second dielectric layer 322, the pad 332a, the first solder resist layer 340, and the surface interconnect 350. The surface interconnect 350 is not in direct contact with the pad 332a. Stage 2 of FIG. 24 illustrates a close up view after the die 304 is coupled to the substrate 302. As shown at stage 2, the UBM layer 370a of the die 304 is coupled to the solder ball 310a. The solder ball 310a is coupled to the pad 332a. The solder ball 310a is not in direct contact with the surface interconnect 350. In some implementations, the solder ball 310a and the pad 332a are configured to provide an electrical path for a first signal (e.g., power signal, input/output signal).

Figure 25:
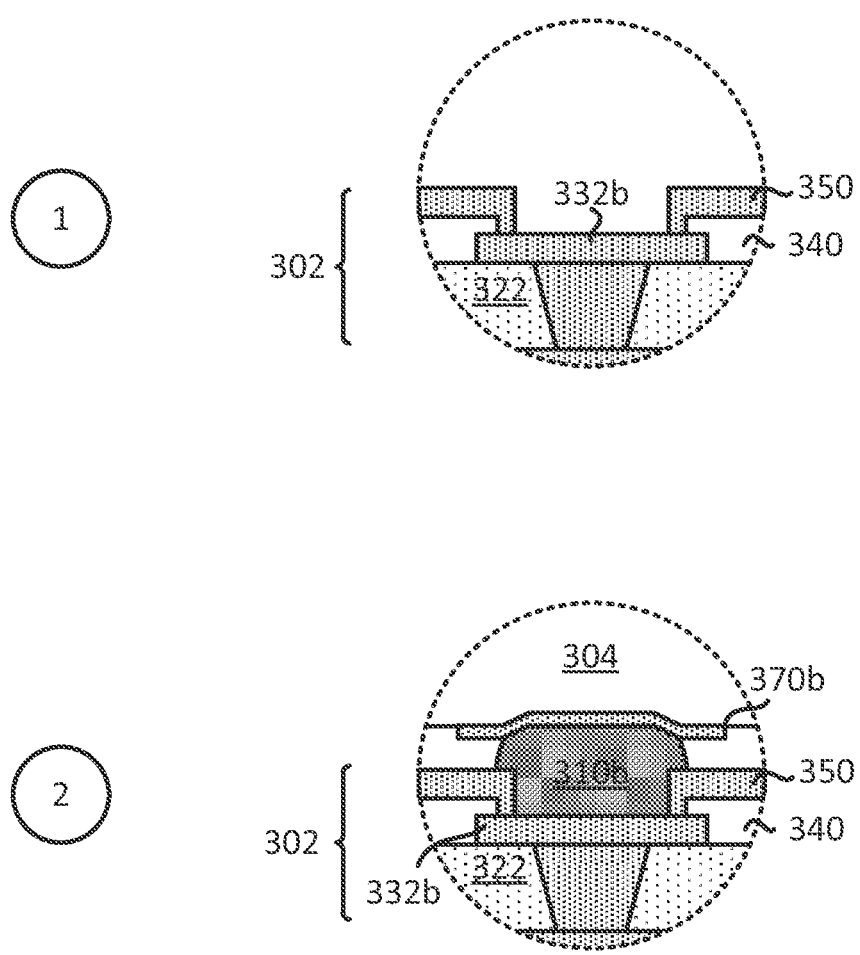
FIG. 25 illustrates a close up view of another portion of a package substrate during a sequence of a die being coupled to a package substrate that includes an interconnect on a solder resist layer.

FIG. 25 illustrates a close up view of a sequence of coupling (e.g., mounting) a die to a substrate. Stage 1 of FIG. 25 illustrates a close up view of another portion of the substrate 302 that includes the second dielectric layer 322, the pad 332b, the first solder resist layer 340, and the surface interconnect 350. The surface interconnect 350 is not in direct contact with the pad 332b. Stage 2 of FIG. 25 illustrates a close up view after the die 304 is coupled to the substrate 302. As shown at stage 2, the UBM layer 370b of the die 304 is coupled to the solder ball 310b. The solder ball 310b is coupled to the pad 332b. The solder ball 310b is coupled to (e.g., in direct contact with) the surface interconnect 350. In some implementations, the solder ball 310b, the pad 332b, and the surface interconnect 350 are configured to provide an electrical path for a second signal (e.g., ground reference signal).

Figure 26:
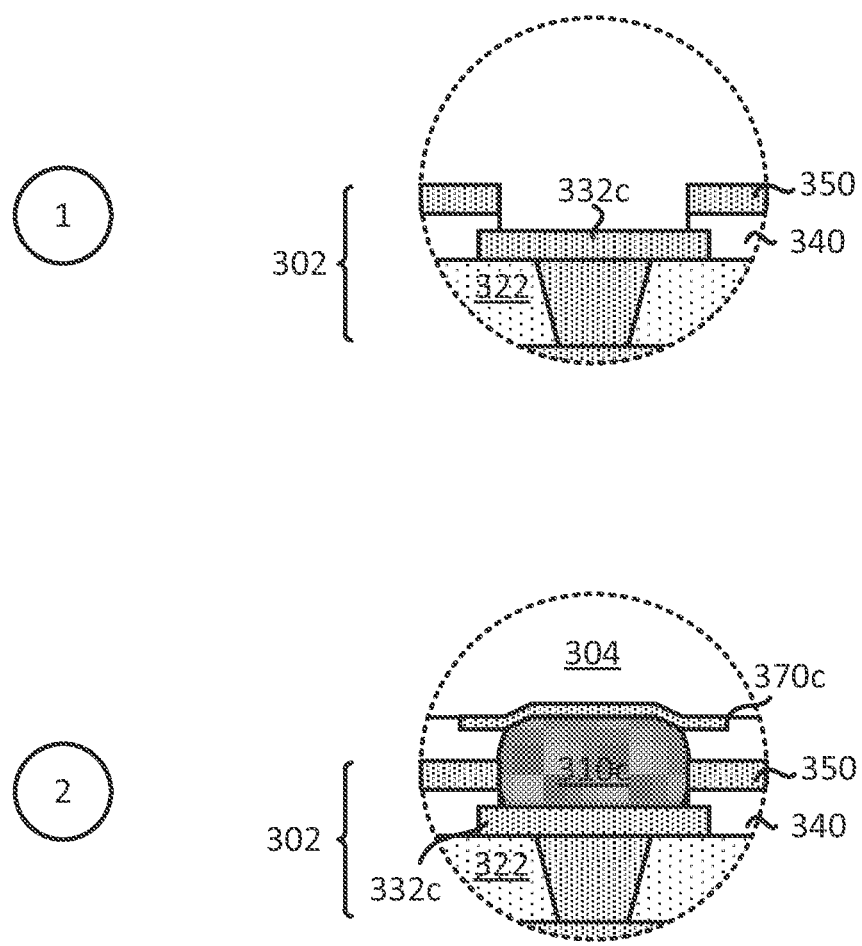
FIG. 26 illustrates a close up view of another portion of a package substrate during a sequence of a die being coupled to a package substrate that includes an interconnect on a solder resist layer.

FIG. 26 illustrates a close up view of a sequence of coupling (e.g., mounting) a die to a substrate. Stage 1 of FIG. 26 illustrates a close up view of another portion of the substrate 302 that includes the second dielectric layer 322, the pad 332c, the first solder resist layer 340, and the surface interconnect 350. The surface interconnect 350 is coupled to in direct contact) with the pad 332c. Stage 2 of FIG. 26 illustrates a close up view after the die 304 is coupled to the substrate 302. As shown at stage 2, the UBM layer 370c of the die 304 is coupled to the solder ball 310c. The solder ball 310c is coupled to the pad 332c. The solder ball 310c is also coupled to (e.g., in direct contact with) the surface interconnect 350. In some implementations, the solder ball 310c, the pad 332c, and the surface interconnect 350 are configured to provide an electrical path for a second signal (e.g., ground reference signal).

Figure 1:
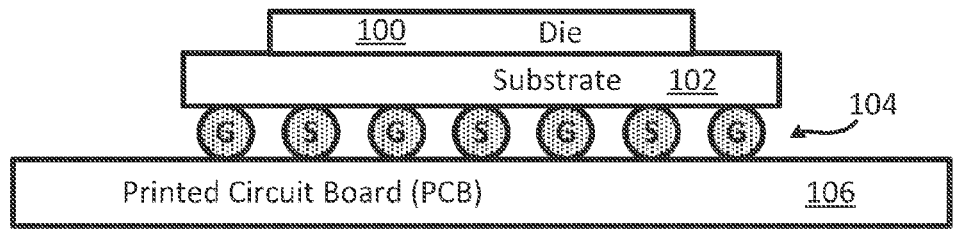
FIG. 1 illustrates a profile view of an integrated device package mounted on a printed circuit board (PCB).
Figure 2:
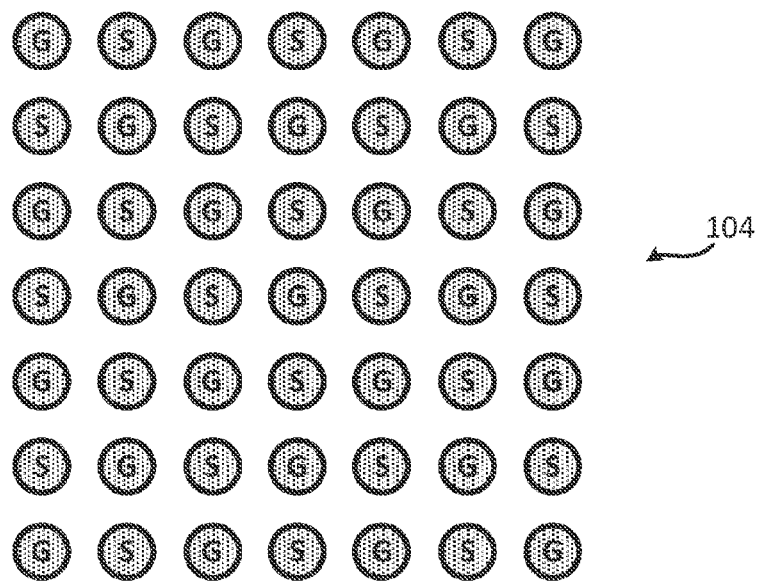
FIG. 2 illustrates a plan view of an arrangement of solder balls between a package substrate and a PCB.
Figure 27A:
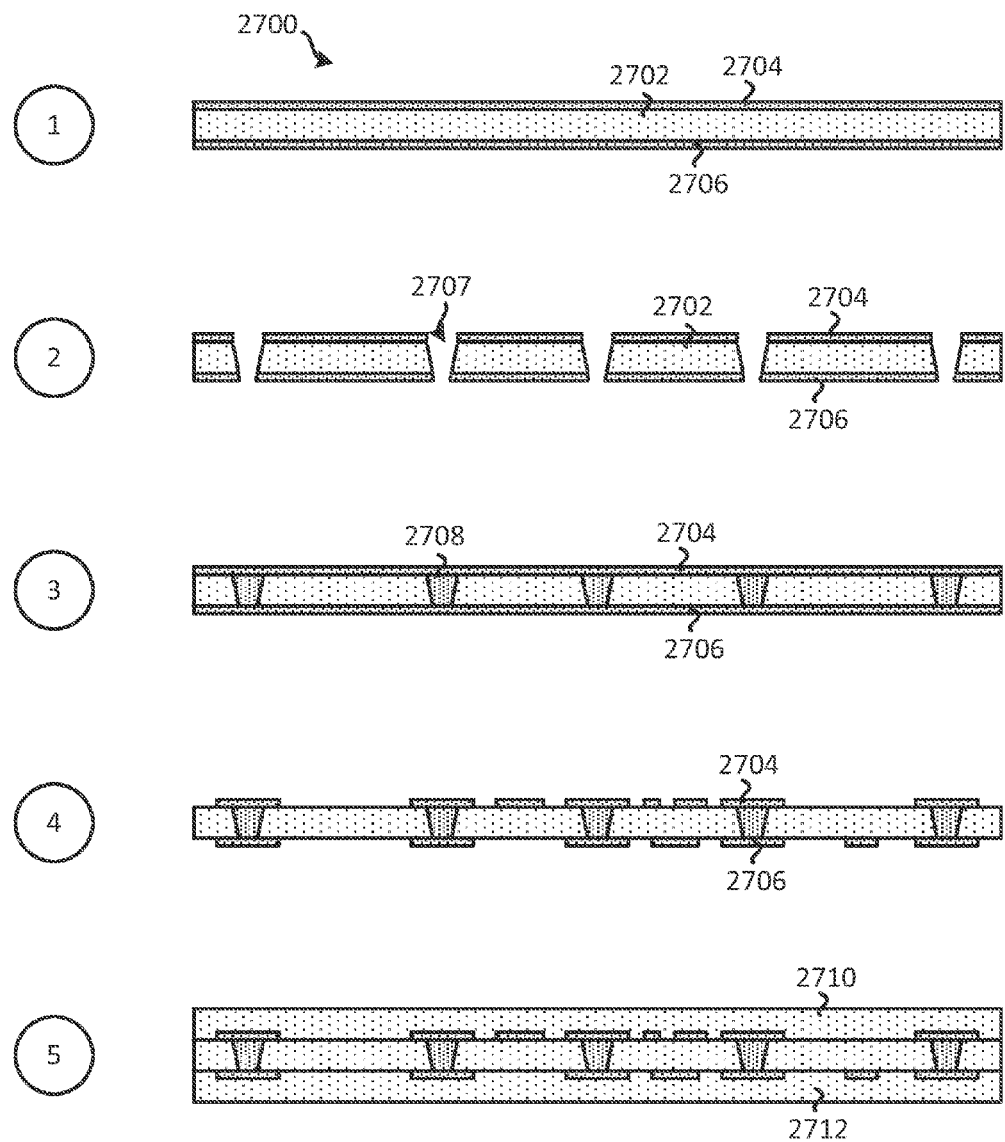
FIG. 27 (comprising FIGS. 27A-27C) illustrates an exemplary sequence for providing/fabricating an integrated device package that includes a package substrate having stacks of interconnects, an interconnect on a solder resist layer, and an interconnect on a side portion of the package substrate.
Figure 27B:
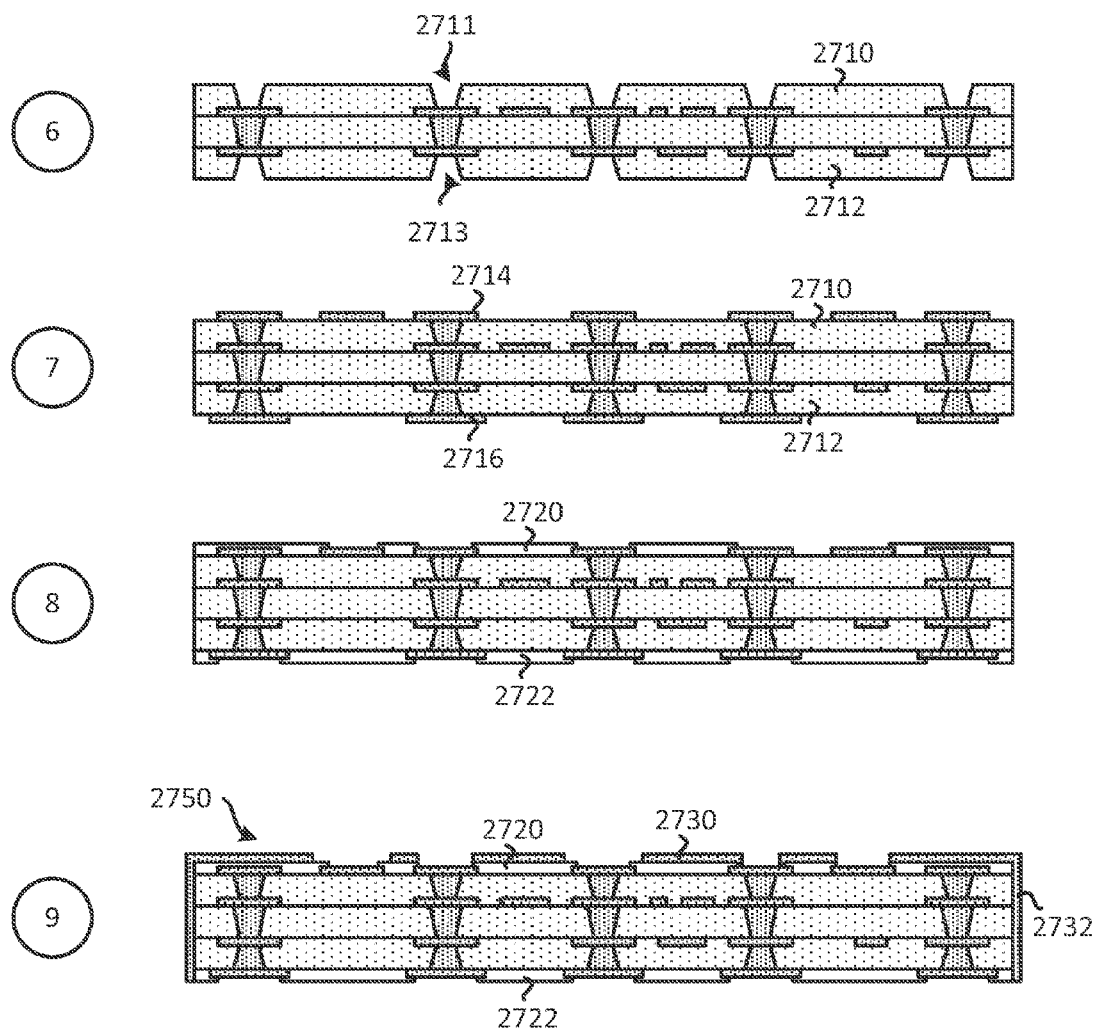
Figure 27C:
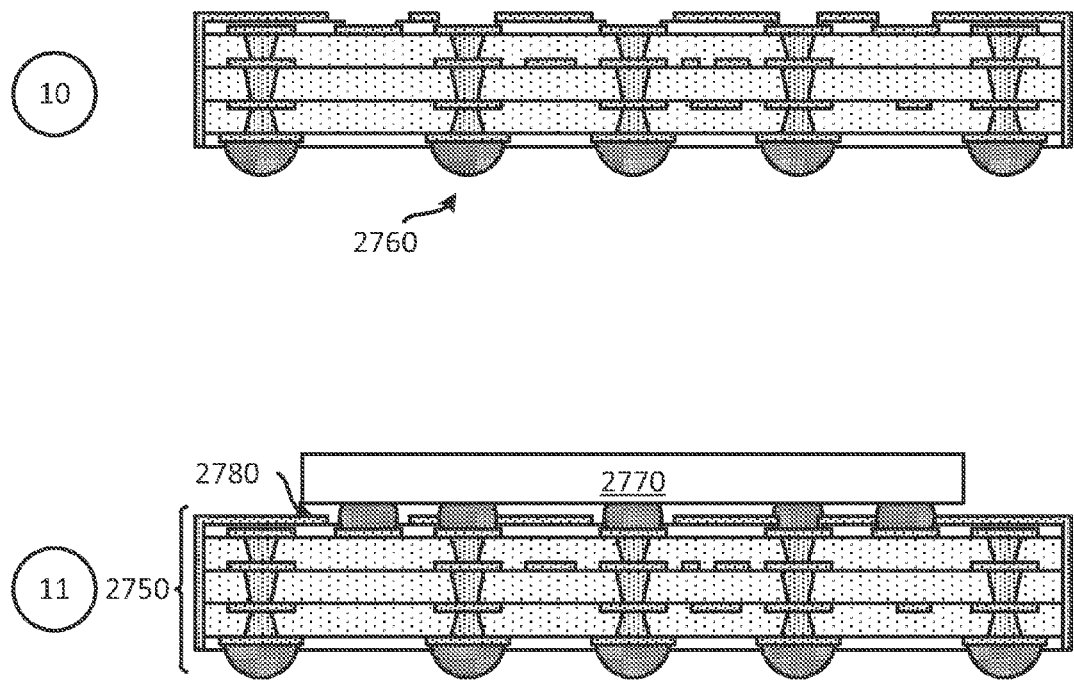

Exemplary Sequence for Providing Fabricating an Integrated Device Package Comprising Substrate with Stacks of Interconnects, Interconnect on Solder Resist Layer and Interconnect on Side Portion of Substrate In some implementations, providing/fabricating a substrate (e.g., package substrate) with stacks of interconnects, a surface interconnect and a side interconnect includes several processes. FIG. 27 (which includes FIGS. 27A-27C) illustrates an exemplary sequence for providing/fabricating a substrate (e.g., package substrate) with stacked interconnects, a surface interconnect and a side interconnect. In some implementations, the sequence of FIGS. 27A-27C may be used to provide/fabricate the substrate of FIGS. 2, 16 and/or other substrates described in the present disclosure. However, for the purpose of simplification, FIGS. 27A-27C will be described in the context of providing/fabricating the substrate of FIG. 2.

It should be noted that the sequence of FIGS. 27A-27C may combine one or more stages in order to simplify and/or clarify the sequence for providing a substrate. In some implementations, the order of the processes may be changed or modified.

Stage 1 of FIG. 27A, illustrates a state after a core layer 2700 is provided. In some implementations, the core layer 2700 is provided by a supplier. In some implementations, the core layer 2700 is fabricated (e.g., formed). The core layer 2700 includes a first dielectric layer 2702, a first metal layer 2704, and a second metal layer 2706. The first metal layer 2704 is on a first surface (e.g., top surface) of the first dielectric layer 2702. The second metal layer 2706 is on a second surface (e.g. bottom surface) of the first dielectric layer 2702.

Stage 2 illustrates a state after several cavities are formed in the core layer 2700. As shown at stage 2, several cavities (e.g., cavity 2707) are formed in the first dielectric layer 2702, the first metal layer 2704, and the second metal layer 2706. Different implementations may use different processes for forming the cavities in the core layer 2700. In some implementations, a laser process and/or a photo etching process (e.g., photo lithography) may be used to form the cavities in the core layer 2700.

Stage 3 illustrates a state after vias (e.g., via 2708) are formed in the cavities (e.g., cavity 2707). Different implementations may use different processes for forming the vias in the cavities. In some implementations, one or more plating process may be used to form the vias. In some implementations, a paste may be use to form the vias.

Stage 4 illustrates a state after portions of the first metal layer 2704 and portions of the second metal layer 2706 are selectively removed (e.g., etching) to define one or more interconnects (e.g., traces, pads, edge interconnects).

Stage 5 illustrates a state after a second dielectric layer 2710 and a third dielectric layer 2712 are formed on the core layer 2700. As shown at stage 5, the second dielectric layer 2710 is formed over the first surface of the first dielectric layer 2702, and the third dielectric layer 2712 is formed over the second surface of the first dielectric layer 2702. In some implementations, the second and third dielectric layers 2710 and 2712 are prepeg layers. It is also noted that the first dielectric layer 2702 may be a prepeg layer in some implementations.

Stage 6, as shown in FIG. 27B, illustrates a state after several cavities cavity 2711) are in formed (e.g., created) in the second dielectric layer 2710, and several cavities (e.g., cavity 2713) are formed in the third dielectric layer 2712. Different implementations may use different processes for forming the cavities in the dielectric layer(s). In some implementations, a laser process and/or a photo etching process (e.g., photo lithography) may be used to form the cavities in the dielectric layer(s).

Stage 7 illustrates a state after a metal layer 2714 is formed in/on the second dielectric layer 2710. The metal layer 2714 formed in the cavity of the second dielectric layer 2710 may define a via. The metal layer 2714 formed on the second dielectric layer 2710 may define one or more interconnects (e.g., traces, pads, edge interconnects).

Stage 7 also illustrates a metal layer 2716 is formed in/on the third dielectric layer 2712. The metal layer 2716 formed in the cavity of the third dielectric layer 2712 may define a via. The metal layer 2716 formed on the third dielectric layer 2712 may define one or more interconnects (e.g., traces, pads, edge interconnects). Different implementations may use different processes for forming the metal layers. In some implementations, one or more plating process may be used to form the metal layers. In some implementations, a paste may be use to form the metal layers (e.g., vias).

Stage 7 illustrates that some of the interconnects that are formed in the first dielectric layer 2702, the second dielectric layer 2710, and/or the third dielectric layer 2712 may be arranged in a stacked configuration, thereby forming a stack of interconnects, as previously described above in at least FIGS. 3 and 16.

Stage 8 illustrates a state after a first solder resist layer 2720 is formed on a the second dielectric layer 2710 and some of the metal layer 2714. Stage 8 also illustrates a state after second solder resist layer 2722 is formed on the third dielectric layer 2712 and some of the metal layer 2716.

Stage 9 illustrates a state after a surface interconnect 2730 is formed over the first solder resist layer 2720. The surface interconnect 2730 may be a patterned surface interconnect. In some implementations, a plating process is used for form the surface interconnect 2730. Stage 9 further illustrates a side surface interconnect 2732 is formed on the side of the substrate (e.g., side of dielectric layers, solder resist layer). In some implementations, the side surface interconnect 2732 is a patterned side surface interconnect. In some implementations, the side surface interconnect 2732 may be defined near and/or around edge interconnects that are formed in/on the dielectric layers. The side surface interconnect 2732 may be the same layer as the surface interconnect 2730. In some implementations, stage 9 illustrates a substrate 2750 that includes stacked interconnects near and/or at the periphery of the substrate, a surface interconnect and a side interconnect.

Stage 10 illustrates a state after a set of solder balls 2760 are coupled to the pads formed from the metal layer 2716. In some implementations, at least a majority of the solder balls from the set of solder balls 2760 are configured to provide at least one electrical path for at least one non-ground reference signal. In some implementations, at least a substantial number (e.g., 70 percent or more) of the solder balls from the set of solder balls 2760 are configured to provide at least one electrical path for at least one non-ground reference signal.

Stage 11 illustrates a state after a die 2770 is coupled to the substrate 2750 through a set of solder balls 2780.

Figure 28:
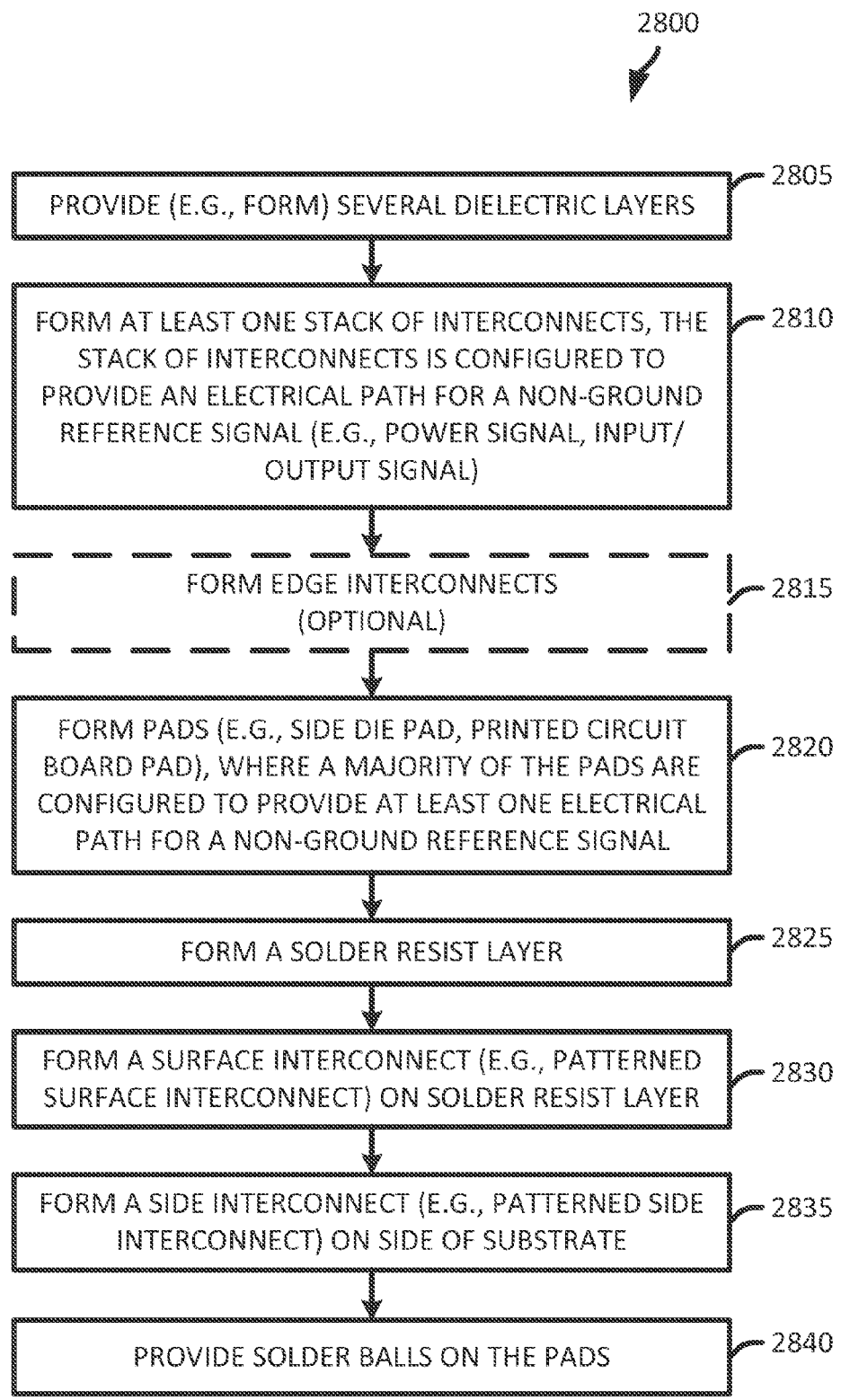
FIG. 28 illustrates an exemplary flow diagram of a method for providing/fabricating an integrated device package that includes a package substrate having stacks of interconnects, an interconnect on a solder resist layer, and an interconnect on a side portion of the package substrate.

Exemplary Flow Diagram of a Method for Providing Fabricating an Integrated Device Package Comprising Substrate with Stacks of Interconnects, Interconnect on Solder Resist Layer and Interconnect on Side Portion of Substrate In some implementations, providing/fabricating a substrate (e.g., package substrate) with stacks of interconnects, a surface interconnect and a side interconnect includes several processes. FIG. 28 illustrates an exemplary flow diagram of a method 2800 for providing/fabricating a substrate (e.g., package substrate) with stacks of interconnects, a surface interconnect and a side interconnect. In some implementations, the method of FIG. 28 to provide/fabricate the substrate of FIG. 3 and/or other substrates in the present disclosure.

It should be noted that the method of FIG. 28 may combine one or more steps in order to simplify and/or clarify the sequence for providing an integrated device. In some implementations, the order of the processes may be changed or modified.

The method provides (at 2805) several dielectric layers. In some implementations, providing several dielectric layers includes forming a core layer and several prepeg layers. In some implementations, only prepeg layers are formed.

The method forms (at 2810) at least one stack of interconnects in the dielectric layers. The stack of interconnects may includes two or more interconnects. An interconnect may includes a trace, a pad, and/or a via. A stack of interconnects may be several interconnects that are substantially arranged in a stack (e.g., vertical stack). A stack of interconnects may be formed in/on several dielectric layers. A set of stacks of interconnects may be positioned in the dielectric layers such that the stacks of interconnects are at least partially located within, at, near, or within the periphery or perimeter of a substrate. The stacks of interconnects may be arranged in an outer row and/or outer column of stacks of interconnects. A first stack of interconnects may be configured to provide an electrical path for at least one first non-ground reference signal. A second stack of interconnects may be configured to provide an electrical path for at least one ground reference signal. Examples of stacks of interconnects (e.g., stacks of interconnects 400, 410) are described above in at least FIG. 4. Different implementations may form interconnects and stacks of interconnects differently. In some implementations, a plating process is used to form interconnects and stacks of interconnects. Examples of forming interconnects (e.g., stack of interconnects) are described in detail in at least FIGS. 29-32 below.

The method optionally forms (at 2815) at least one edge interconnects. The edge interconnects may be formed to couple to one or more stacks of interconnects. Examples of edge interconnects are described above in at least FIGS. 12-14. Examples of forming interconnects (e.g., edge interconnects) are described in detail in at least FIGS. 29-32 below.

The method forms (at 2820) pads on at least one of the dielectric layer. The pads may be die side pads (e.g., die side solder ball pads) and/or printed circuit board (PCB) side pads (e.g., PCB side solder ball pads) of a substrate. A majority, or a substantial majority (e.g., 60 percent or more) of the pads are configured to provide at least one electrical path for at least one non-ground reference signal.

The method forms (at 2825) at least one solder resist layer on one or more dielectric layer.

The method also forms (at 2830) a surface interconnect on the solder resist layer. The surface interconnect may be a patterned metal layer. The surface interconnect may be configured to provide a ground reference signal.

The method forms (at 2835) a side interconnect on the side of the substrate. The side interconnect may be a patterned metal layer. The side interconnect may be configured to provide a ground reference signal. The side interconnect may be coupled (e.g., touching) to the surface interconnect. In some implementations, side interconnect may be coupled to one or more stacks of interconnects (e.g., stacks of interconnects configured to provide an electrical path for a ground reference signal).

The method provides (at 2840) solder balls to the pads. Some of the solder balls may be configured to provide an electrical path for a ground reference signal. A majority of the solder balls may be configured to provide at least one electrical path for at least one non-ground reference signal (e.g., power signal, input/output signal).

Exemplary Semi-Additive Patterning (SAP) Process

Various interconnects (e.g., traces, vias, pads) and metal layers are described in the present disclosure. In some implementations, these interconnects may include one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, surface interconnect, side interconnect). In some implementations, these processes include a semi-additive patterning (SAP) process and a damascene process. These various different processes are further described below.

Figure 29:
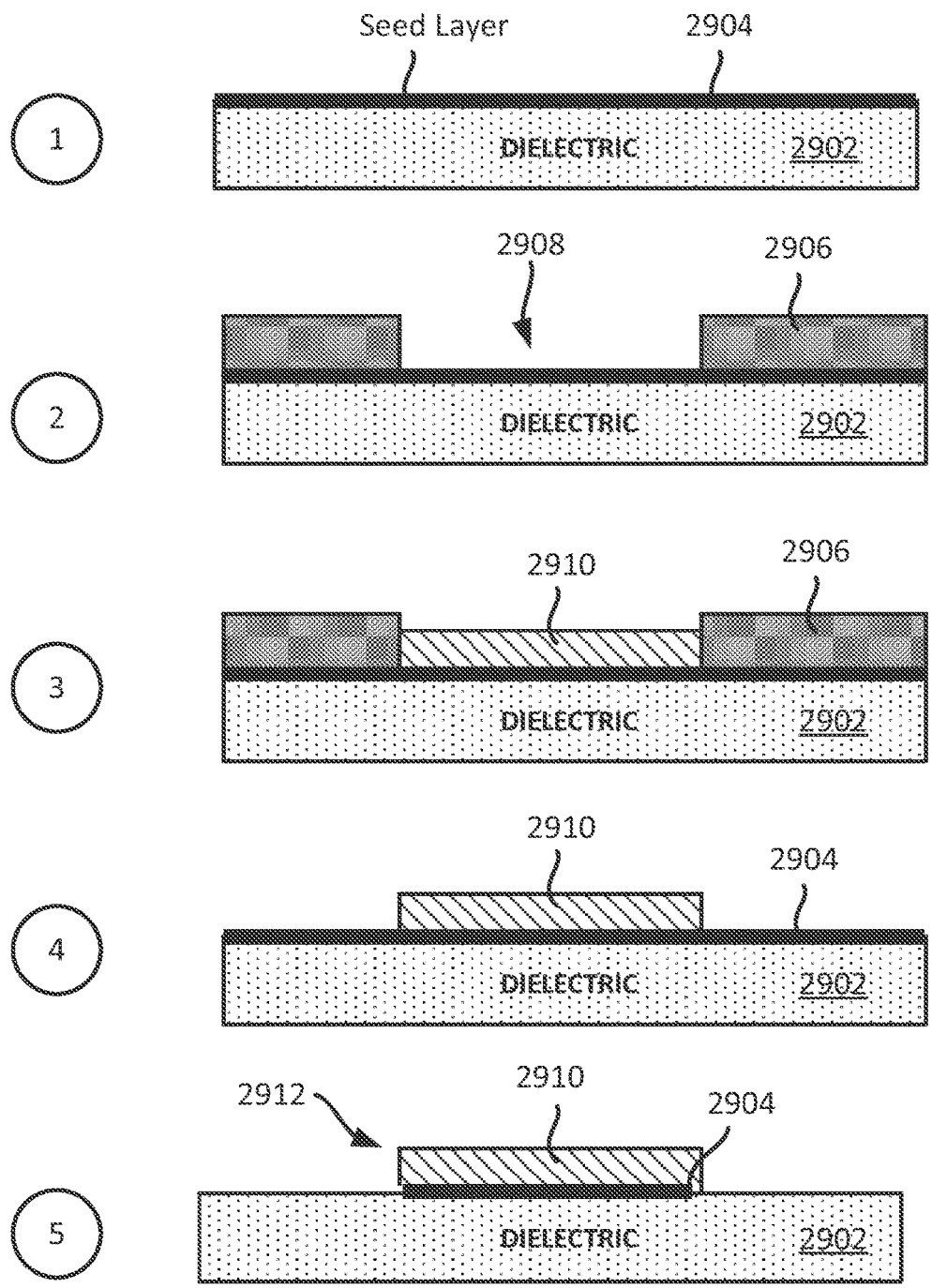
FIG. 29 illustrates an example of a semi-additive patterning (SAP) process.

FIG. 29 illustrates a sequence for forming an interconnect using a semi-additive patterning (SAP) process to provide and/or form an interconnect in one or more dielectric layer(s). As shown in FIG. 29, stage 1 illustrates a state of an integrated device (e.g., substrate) after a dielectric layer 2902 is provided (e.g., formed). In some implementations, stage 1 illustrates that the dielectric layer 2902 includes a first metal layer 2904. The first metal layer 2904 is a seed layer in some implementations. In some implementations, the first metal layer 2904 may be provided (e.g., formed) on the dielectric layer 2902 after the dielectric layer 2902 is provided (e.g., received or formed). Stage 1 illustrates that the first metal layer 2904 is provided (e.g., formed) on a first surface of the dielectric layer 2902. In some implementations, the first metal layer 2904 is provided by using a deposition process (e.g., PVD, CVD, plating process).

Stage 2 illustrates a state of the integrated device after a photo resist layer 2906 (e.g., photo develop resist layer) is selectively provided (e.g., formed) on the first metal layer 2904. In some implementations, selectively providing the resist layer 2906 includes providing a first resist layer 2906 on the first metal layer 2904 and selectively removing portions of the resist layer 2906 by developing (e.g., using a development process). Stage 2 illustrates that the resist layer 2906 is provided such that a cavity 2908 is formed.

Stage 3 illustrates a state of the integrated device after a second metal layer 2910 is formed in the cavity 2908. In some implementations, the second metal layer 2910 is formed over an exposed portion of the first metal layer 2904. In some implementations, the second metal layer 2910 is provided by using a deposition process (e.g., plating process).

Stage 4 illustrates a state of the integrated device after the resist layer 2906 is removed. Different implementations may use different processes for removing the resist layer 2906.

Stage 5 illustrates a state of the integrated device after portions of the first metal layer 2904 are selectively removed. In some implementations, one or more portions of the first metal layer 2904 that is not covered by the second metal layer 2910 are removed. As shown in stage 5, the remaining first metal layer 2904 and the second metal layer 2910 may form and/or define an interconnect 2912 (e.g., trace, vias, pads) in an integrated device and/or a substrate. In some implementations, the first metal layer 2904 is removed such that a dimension (e.g., length, width) of the first metal layer 2904 underneath the second metal layer 2910 is about the same or smaller than a dimension (e.g., length, width) of the second metal layer 2910, which can result in an undercut, as shown at stage 5 of FIG. 29. In some implementations, the above mentioned processes may be iterated several times to provide and/or form several interconnects in one or more dielectric layers of an integrated device and/or substrate.

Figure 30:
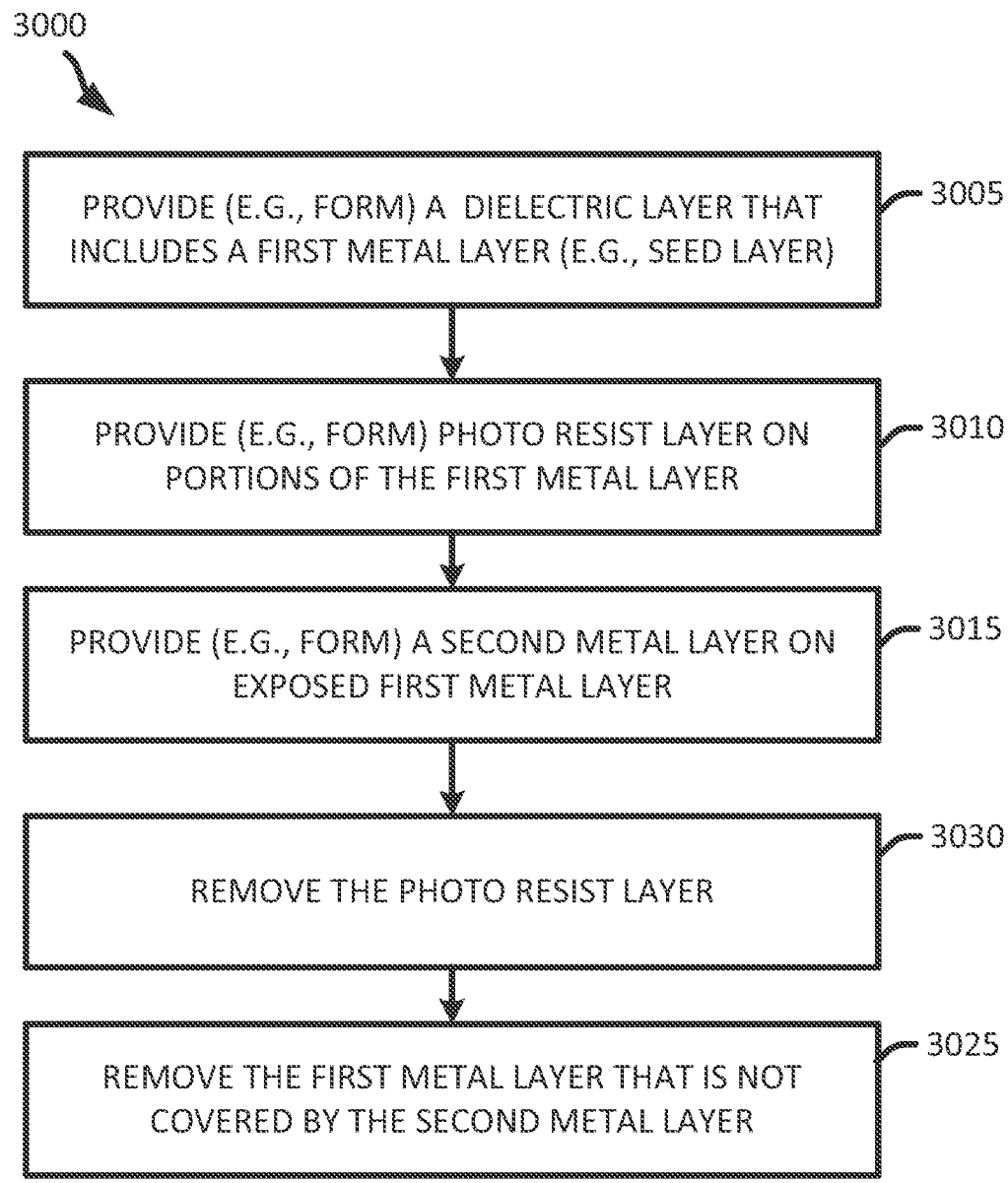
FIG. 30 illustrates an example of flow diagram of a semi-additive patterning (SAP) process.

FIG. 30 illustrates a flow diagram for a method for using a (SAP) process to provide and/or form an interconnect in one or more dielectric layer(s). The method provides (at 3005) a dielectric layer (e.g., dielectric layer 2902). In some implementations, providing the dielectric layer includes forming the dielectric layer. In some implementations, providing the dielectric layer includes forming a first metal layer (e.g., first metal layer 2904). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 3010) a photo resist layer (e.g., a photo develop resist layer 2906) on the first metal layer. In some implementations, selectively providing the resist layer includes providing a first resist layer on the first metal layer and selectively removing portions of the resist layer (which provides one or more cavities).

The method then provides (at 3015) a second metal layer (e.g., second metal layer 2910) in the cavity of the photo resist layer. In some implementations, the second metal layer is formed over an exposed portion of the first metal layer. In some implementations, the second metal layer is provided by using a deposition process (e.g., plating process).

The method further removes (at 3020) the resist layer. Different implementations may use different processes for removing the resist layer. The method also selectively removes (at 3025) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 31:
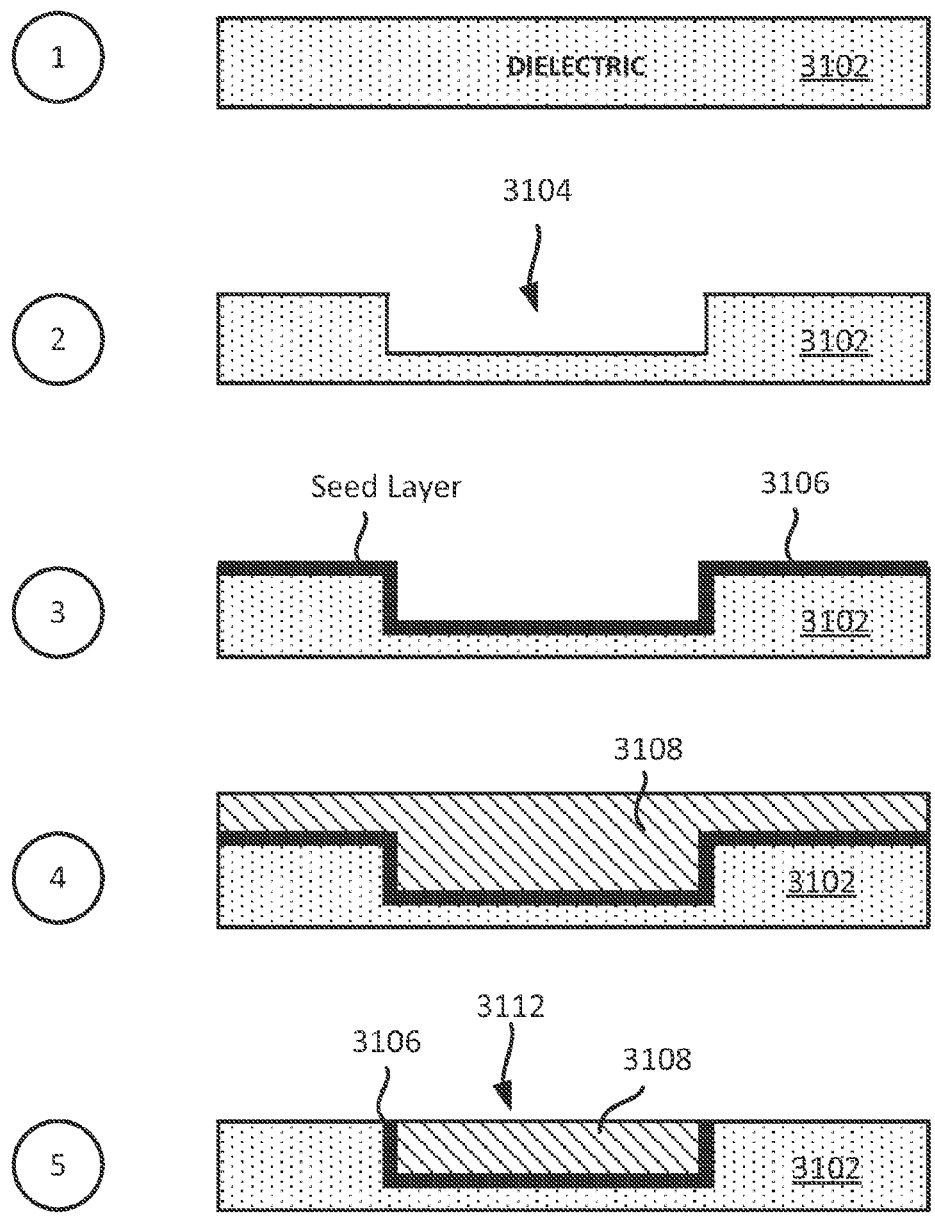
FIG. 31 illustrates an example of a damascene process.

FIG. 31 illustrates a sequence for forming an interconnect using a damascene process to provide and/or form an interconnect in a dielectric layer. As shown in FIG. 31, stage 1 illustrates a state of an integrated device after a dielectric layer 3102 is provided (e.g., formed). In some implementations, the dielectric layer 3102 is an inorganic layer (e.g., inorganic film).

Stage 2 illustrates a state of an integrated device after a cavity 3104 is formed in the dielectric layer 3102. Different implementations may use different processes for providing the cavity 3104 in the dielectric layer 3102.

Stage 3 illustrates a state of an integrated device after a first metal layer 3106 is provided on the dielectric layer 3102. As shown in stage 3, the first metal layer 3106 provided on a first surface of the dielectric layer 3102. The first metal layer 3106 is provided on the dielectric layer 3102 such that the first metal layer 3106 takes the contour of the dielectric layer 3102 including the contour of the cavity 3104. The first metal layer 3106 is a seed layer in some implementations. In some implementations, the first metal layer 3106 is provided by using a deposition process (e.g., physical vapor deposition (PVD), Chemical Vapor Deposition (CVD) or plating process).

Stage 4 illustrates a state of the integrated device after a second metal layer 3108 is formed in the cavity 3104 and a surface of the dielectric layer 3102. In some implementations, the second metal layer 3108 is formed over an exposed portion of the first metal layer 3106. In some implementations, the second metal layer 3108 is provided by using a deposition process (e.g., plating process).

Stage 5 illustrates a state of the integrated device after the portions of the second metal layer 3108 and portions of the first metal layer 3106 are removed. Different implementations may use different processes for removing the second metal layer 3108 and the first metal layer 3106. In some implementations, a chemical mechanical planarization (CMP) process is used to remove portions of the second metal layer 3108 and portions of the first metal layer 3106. As shown in stage 5, the remaining first metal layer 3106 and the second metal layer 3108 may form and/or define an interconnect 3112 (e.g., trace, vias, pads) in an integrated device and/or a substrate. As shown in stage 5, the interconnect 3112 is formed in such a way that the first metal layer 3106 is formed on the base portion and the side portion(s) of the second metal layer 3110. In some implementations, the cavity 3104 may include a combination of trenches and/or holes in two levels of dielectrics so that via and interconnects (e.g., metal traces) may be formed in a single deposition step. In some implementations, the above mentioned processes may be iterated several times to provide and/or form several interconnects in one or more dielectric layers of an integrated device and/or substrate.

Figure 32:
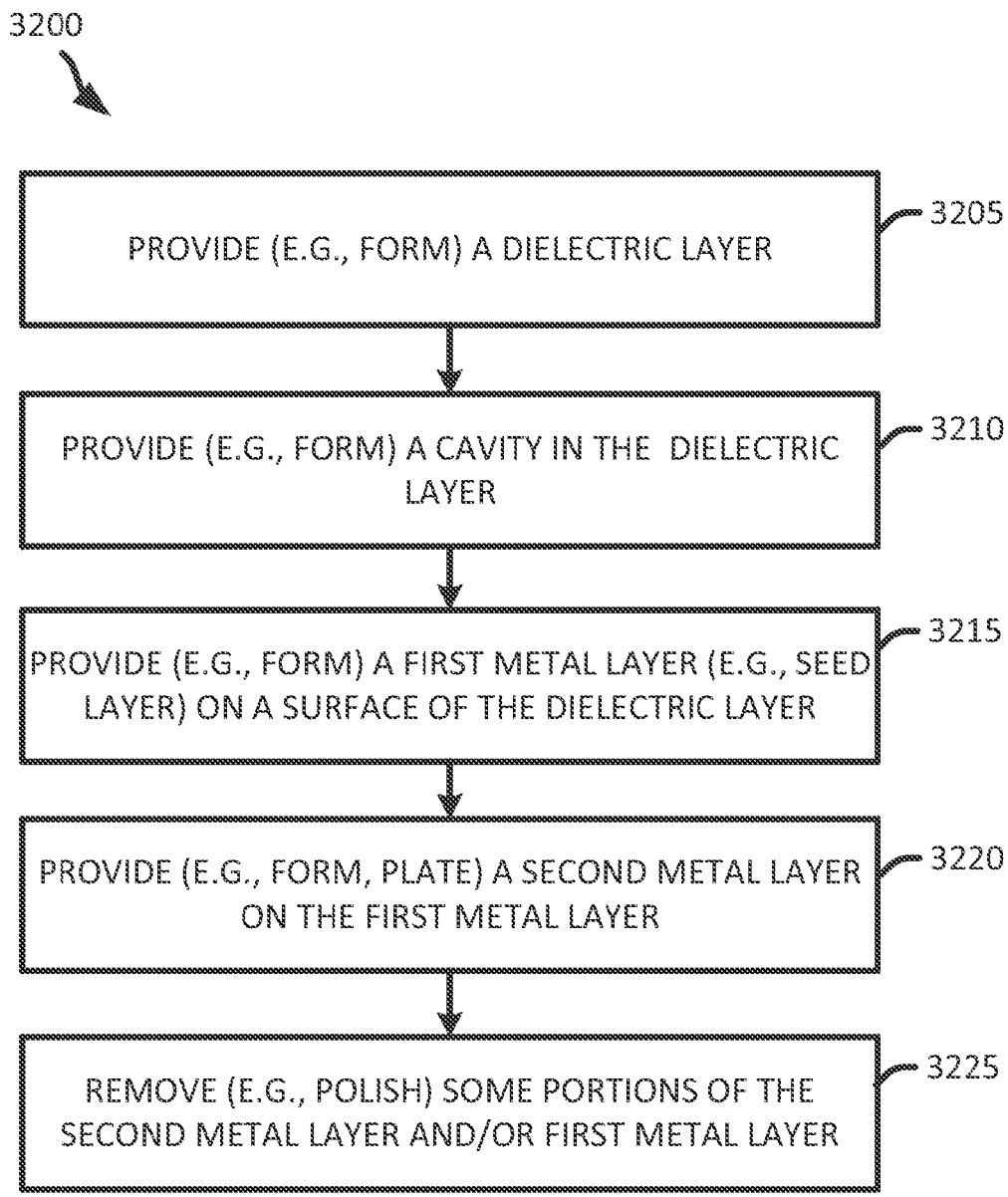
FIG. 32 illustrates an example of a flow diagram of a damascene process.

FIG. 32 illustrates a flow diagram of a method 3200 for forming an interconnect using a damascene process to provide and/or form an interconnect in a dielectric layer. The method provides (at 3205) a dielectric layer (e.g., dielectric layer 3102). In some implementations, providing a dielectric layer includes forming: a dielectric layer. In some implementations, providing a dielectric layer includes receiving a dielectric layer from a supplier. In some implementations, the dielectric layer is an inorganic layer (e.g., inorganic film).

The method forms (at 3210) at least one cavity (e.g., cavity 3104) in the dielectric layer. Different implementations may use different processes for providing the cavity in the dielectric layer.

The method provides (at 3215) a first metal layer (e.g., first metal layer 3106) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 3106 is provided by using a deposition process (e.g., PVD, CVD or plating process).

The method provides (at 3220) a second metal layer (e.g., second metal layer 3108) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 3225) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 3112). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 33:
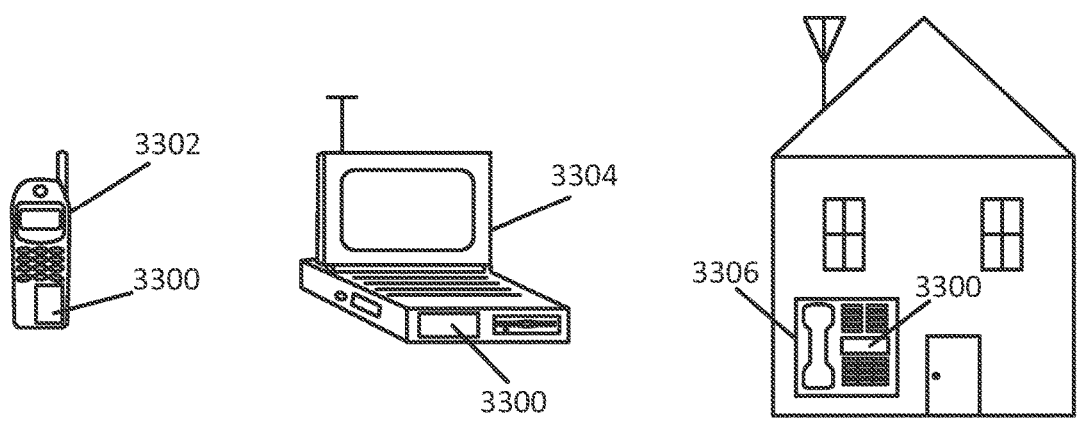
FIG. 33 illustrates various electronic devices that may integrate an integrated device package, a package substrate, a semiconductor device, a die, an integrated circuit and/or PCB described herein.

FIG. 33 illustrates various electronic devices that may be integrated with any of the aforementioned integrated device, semiconductor device, integrated circuit, die, interposer, package or package-on-package (PoP). For example, a mobile phone device 3302, a laptop computer device 3304, and a fixed location terminal device 3306 may include an integrated device 3300 as described herein. The integrated device 3300 may be, for example, any of the integrated circuits, dies, integrated devices, integrated device packages, integrated circuit devices, package-on-package devices described herein. The devices 3302, 3304, 3306 illustrated in FIG. 33 are merely exemplary. Other electronic devices may also feature the integrated device 3300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, steps, features, and/or functions illustrated in FIGS. 3, 4, 5, 6, 7, 8, 9, 10, 11, 12, 13, 14, 15, 16, 17, 18, 19, 20, 21, 22, 23, 24, 25, 26, 27A-27C, 28, 29, 30, 31, 32, and/or 33 may be rearranged and/or combined into a single component, step, feature or function or embodied in several components, steps, or functions. Additional elements, components, steps, and/or functions may also be added without departing from the disclosure. It should also be noted that FIGS. 3, 4, 5, 6, 7, 8, 9, 10, 11, 12, 13, 14, 15, 16, 17, 18, 19, 20, 21, 22, 23, 24, 25, 26, 27A-27C, 28, 29, 30, 31, 32, and/or 33 and its corresponding description in the present disclosure is not limited to dies and/or ICs. In some implementations, FIGS. 3, 4, 5, 6, 7, 8, 9, 10, 11, 12, 13, 14, 15, 16, 17, 18, 19, 20, 21, 22, 23, 24, 25, 26, 27A-27C, 28, 29, 30, 31, 32, and/or 33 and its corresponding description may be used to manufacture, create, provide, and/or produce integrated devices. In some implementations, a device may include a die, a die package, an integrated circuit (IC), an integrated device, an integrated device package, a wafer, a semiconductor device, a package on package, a package substrate and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches Object B, and object B touches object C, then objects A and C may still be considered coupled to one another even if they do not directly physically touch each other.

A 'set' of objects may include one or more objects. For example, a set of interconnects may include one or more interconnects. A set of solder balls may include one or more solder balls. A set of vias may include one or more vias. A set of pads may include one or more pads. A set of stacks of interconnects may include one or more stack of interconnects.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure, it should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
    a die; and
    a package substrate coupled to the die, the package substrate comprising:
        at least one dielectric layer;
        a first stack of first interconnects in the at least one dielectric layer, the first stack of first interconnects configured to provide a first electrical path for a first non-ground reference signal, wherein the first stack of first interconnects is located along at least one side of the package substrate;
        a second stack of first interconnects in the at least one dielectric layer, the second stack of first interconnects configured to provide another electrical path for a second non-ground reference signal, wherein the second stack of first interconnects is located along at least one side of the package substrate; and
        a second interconnect formed on at least one exterior side portion of the at least one dielectric layer, wherein the second interconnect is configured to provide a second electrical path for a ground reference signal, wherein the second interconnect is configured to at least partially isolate the first non-ground reference signal passing through the first stack of first interconnects, from the second non-ground reference signal passing through the second stack of first interconnects.

2. The package of claim 1, wherein the package substrate includes a set of pads on a printed circuit board (PCB) side of the package substrate, wherein a majority of the pads from the set of pads are configured to provide a plurality of electrical paths for at least one non-ground reference signal, the set of pads includes all the pads located on the PCB side of the package substrate.

3. The package of claim 1, wherein the package substrate includes a set of pads on a die side of the package substrate, wherein a majority of the pads from the set of pads are configured to provide a plurality of electrical paths for at least one non-ground reference signal, the set of pads includes all the pads located on the die side of the package substrate.

4. The package of claim 1, wherein the package substrate further comprises a plurality of first stacks of first interconnects that includes the first stack of first interconnects, the plurality of first stacks of first interconnects are at least partially located within a periphery of the package substrate.

5. The package of claim 4, wherein the periphery of the package substrate includes a portion of the package substrate that is about within 300 microns (μm) or less of a side of the package substrate.

6. The package of claim 1, wherein the first stack of first interconnects comprises a stack of vias.

7. The package of claim 1, wherein the package substrate further comprises:
    a solder resist layer on the at least one dielectric layer; and
    a third interconnect on the solder resist layer, wherein the third interconnect is configured to provide the second electrical path for the ground reference signal.

8. The package of claim 7, wherein the third interconnect is a patterned interconnect.

9. The package of claim 8, wherein the patterned interconnect is patterned to at least partially mirror a top level interconnect of the package substrate.

10. The package of claim 7, wherein the package substrate further comprises a fourth interconnect on the solder resist layer, wherein the fourth interconnect is configured to provide a third electrical path for a second ground reference signal.

11. The package of claim 10, wherein the ground reference signal and the second ground reference signal are signals from a group of signals comprising a general ground reference signal, an analog ground reference signal, a digital ground reference signal, and/or a radio frequency ground reference signal.

12. The package of claim 1, wherein the second interconnect is directly coupled to an interconnect in the at least one dielectric layer.

13. The package of claim 1, wherein the second interconnect is at least partially located in the at least one dielectric layer.

14. The package of claim 1, wherein the package substrate comprises a plurality of first stacks of first interconnects, the plurality of first stacks of first interconnects includes the first stack of first interconnects, the plurality of first stacks of first interconnects are located in one of at least a row or a column along a side of the package substrate.

15. The package of claim 1, wherein the package substrate further comprises at least one fourth stack of fourth interconnects located in the at least one dielectric layer, the at least one fourth stack of fourth interconnects is configured to provide the third electrical path for the ground reference signal, wherein the at least one fourth stack of fourth interconnects is at least partially located within a periphery of the package substrate.

16. The package of claim 15, wherein the at least one fourth stack of fourth interconnects is coupled to the second interconnect.

17. The package of claim 1, wherein the first non-ground reference signal includes one of at least a power signal and/or an input/output signal.

18. The package of claim 1, wherein the package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and/or a device in an automotive vehicle, and further including the device.

19. A device comprising:
    a package substrate comprising:
        at least one dielectric layer;
        a first stack of first interconnects in the at least one dielectric layer, the first stack of first interconnects configured to provide a first electrical path for a first non-ground reference signal, wherein the first stack of first interconnects is located along at least one side of the package substrate;

a second stack of first interconnects in the at least one dielectric layer, the second stack of first interconnects configured to provide another electrical path for a second non-ground reference signal, wherein the second stack of first interconnects is located along at least one side of the package substrate; and a second interconnect formed on at least one exterior side portion of the at least one dielectric layer, wherein the second interconnect is configured to provide a second electrical path for a ground reference signal, wherein the second interconnect is configured to at least partially isolate the first non-ground reference signal passing through the first stack of first interconnects, from the second non-ground reference signal passing through the second stack of first interconnects; and a die coupled to the package substrate through a set of solder balls.

20. The device of claim 19, wherein a majority of the solder balls from the set of solder balls are configured to provide a plurality of electrical paths for at least one non-ground reference signal, the set of solder balls includes all the solder balls coupling the die to the package substrate.

21. The device of claim 19, wherein the first stack of first interconnects is at least partially located within a periphery of the package substrate, the periphery of the package substrate includes a portion of the package substrate that is about within 300 microns ($\mu$m) or less of a side portion of the package substrate.

22. The device of claim 19, wherein the package substrate further comprises:

a solder resist layer on the at least one dielectric layer; and a third interconnect on the solder resist layer, wherein the third interconnect is configured to provide the second electrical path for the ground reference signal, wherein at least one of the solder balls from the set of solder balls is coupled to the third interconnect.

23. The device of claim 19, wherein the second interconnect is at least partially located in the at least one dielectric layer.

24. The device of claim 19, wherein the package substrate further comprises at least one fourth stack of fourth interconnects located in the at least one dielectric layer, the at least one fourth stack of fourth interconnects is configured to provide the second electrical path for the ground reference signal, wherein the at least one fourth stack of fourth interconnects is at least partially located within a periphery of the package substrate.

25. The device of claim 19, wherein the device is incorporated into an electronic device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and/or a device in an automotive vehicle, and further including the electronic device.

26. A method for fabricating a package substrate, comprising:

forming at least one dielectric layer;

forming a first electrical path for at least one first non-ground reference signal, wherein forming the first electrical path comprises forming a first stack of first interconnects in the at least one dielectric layer such that the first stack of first interconnects is located along at least one side of the package substrate;

forming another electrical path for at least one second non-ground reference signal, wherein forming the second electrical path comprises forming a second stack of first interconnects in the at least one dielectric layer such that the second stack of first interconnects is located along at least one side of the package substrate; and forming a second electrical path for a ground reference signal, wherein forming the second electrical path comprises forming a second interconnect on at least one exterior side portion of the at least one dielectric layer such that the second interconnect is configured to at least partially isolate the first non-ground reference signal passing through the first stack of first interconnects, from the second non-ground reference signal passing through the second stack of first interconnects.

27. The method of claim 26, wherein forming the first electrical path further comprises forming a set of pads on a printed circuit board (PCB) side of the package substrate such that the set of pads on the PCB side of the package substrate are a majority of the pads located on the PCB side of the package substrate.

28. The method of claim 26, wherein forming the first electrical path further comprises forming a set of pads on a die side of the package substrate such that the set of pads on the die side of the package substrate are a majority of the pads located on the die side of the package substrate.

29. The method of claim 26, wherein forming the first stack of first interconnects comprises forming the first stack of first interconnect at least partially within a periphery of the package substrate.

30. The method of claim 26, wherein forming the first stack of first interconnects includes forming a stack of vias.

31. The method of claim 26 further comprising:

forming a solder resist layer on the at least one dielectric layer; and forming a second electrical path for the ground reference signal, wherein forming the second electrical path comprises forming a third interconnect on the solder resist layer.

32. The method of claim 26, wherein forming the second interconnect comprising forming the second interconnect at least partially in the at least one dielectric layer.

33. The method of claim 26, wherein the package substrate is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and/or a device in an automotive vehicle.

* * * * *